US010715757B2

(12) United States Patent
Kawahito

(10) Patent No.: US 10,715,757 B2
(45) Date of Patent: Jul. 14, 2020

(54) A/D CONVERTER

(71) Applicant: NATIONAL UNIVERSITY CORPORATION SHIZUOKA UNIVERSITY, Shizuoka-shi, Shizuoka (JP)

(72) Inventor: Shoji Kawahito, Hamamatsu (JP)

(73) Assignee: NATIONAL UNIVERSITY CORPORATION SHIZUOKA UNIVERSITY (JP)

( * ) Notice: Subject to any disclaimer, the term of this patent is extended or adjusted under 35 U.S.C. 154(b) by 0 days.

(21) Appl. No.: 16/349,016

(22) PCT Filed: Nov. 9, 2017

(86) PCT No.: PCT/JP2017/040436
§ 371 (c)(1),
(2) Date: May 10, 2019

(87) PCT Pub. No.: WO2018/088476
PCT Pub. Date: May 17, 2018

(65) Prior Publication Data
US 2019/0268557 A1    Aug. 29, 2019

(30) Foreign Application Priority Data
Nov. 11, 2016   (JP) ................................ 2016-220644

(51) Int. Cl.
*H04N 5/378*    (2011.01)
*H03M 1/14*    (2006.01)
(Continued)

(52) U.S. Cl.
CPC .............. *H04N 5/378* (2013.01); *H03M 1/14* (2013.01); *H03M 1/141* (2013.01); *H03M 1/38* (2013.01); *H04N 5/3765* (2013.01)

(58) Field of Classification Search
None
See application file for complete search history.

(56) References Cited

U.S. PATENT DOCUMENTS 7,893,859 B2 * 2/2011 Kawahito ............... H03M 1/00
341/158
9,236,879 B2 * 1/2016 Kawahito ............... H03M 1/18
(Continued)

FOREIGN PATENT DOCUMENTS

| JP | 2014-239426 A | 12/2014 |
| JP | 5769178 B2 | 8/2015 |
| WO | WO 2011/142452 A1 | 11/2011 |

OTHER PUBLICATIONS

International Search Report dated Feb. 6, 2018 in the counterpart Patent Application No. PCT/JP2017/040436.
(Continued)

*Primary Examiner* — Cynthia Segura
(74) *Attorney, Agent, or Firm* — Ostrolenk Faber LLP

(57) ABSTRACT

An A/D converter 1 includes a front stage A/D conversion unit (3) including a first A/D conversion unit (6) that receives an analog signal from a CMOS image sensor (100) and generates a first digital value (D1) and a first residual analog signal ($V_{OPF}$) through a folding integration A/D conversion operation, and a second A/D conversion unit (7) that receives a first residual analog signal ($V_{OPF}$) from the first A/D conversion unit (6) and generates a second digital value (D2) and a second residual analog signal ($V_{OPC}$) through a cyclic A/D conversion operation, and a rear stage A/D conversion unit (4) that receives the second residual analog signal ($V_{OPC}$) from the front stage A/D conversion unit (3) and generates a third digital value (D3) through an acyclic A/D conversion operation.

5 Claims, 14 Drawing Sheets

(51) Int. Cl.
*H03M 1/38* (2006.01)
*H04N 5/376* (2011.01)

(56) References Cited

U.S. PATENT DOCUMENTS

| | | | | |
|---|---|---|---|---|
| 2007/0001893 | A1* | 1/2007 | Shinohara | H03M 1/002 341/169 |
| 2008/0013858 | A1* | 1/2008 | Hohda | H04N 5/217 382/275 |
| 2008/0169955 | A1* | 7/2008 | Inada | H03M 1/1023 341/156 |
| 2009/0040089 | A1* | 2/2009 | Dosho | H03M 1/1215 341/161 |
| 2009/0303358 | A1* | 12/2009 | Kawahito | H03M 1/1245 348/255 |
| 2011/0234441 | A1* | 9/2011 | Makihara | H03M 1/1225 341/172 |
| 2016/0182845 | A1* | 6/2016 | Hagihara | H03M 1/12 348/301 |

OTHER PUBLICATIONS

International Preliminary Report on Patentability (IPRP) dated May 16, 2019 in the counterpart Patent Application No. PCT/JP2017/040436.

* cited by examiner

Fig.7
(a)
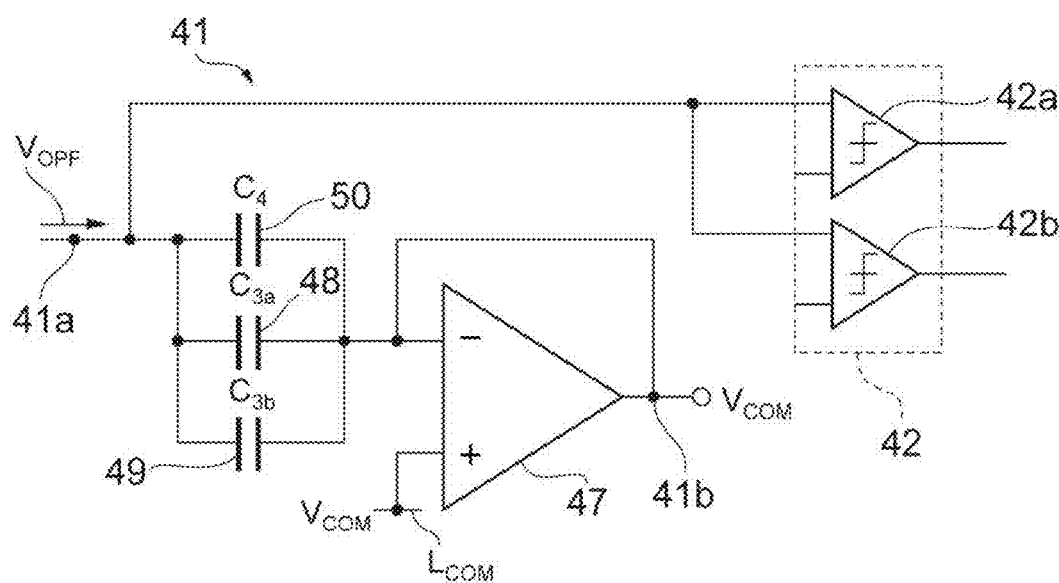
(b)
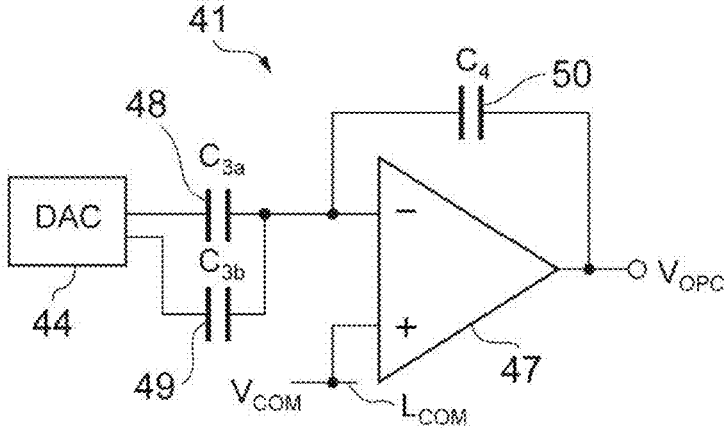
(c)
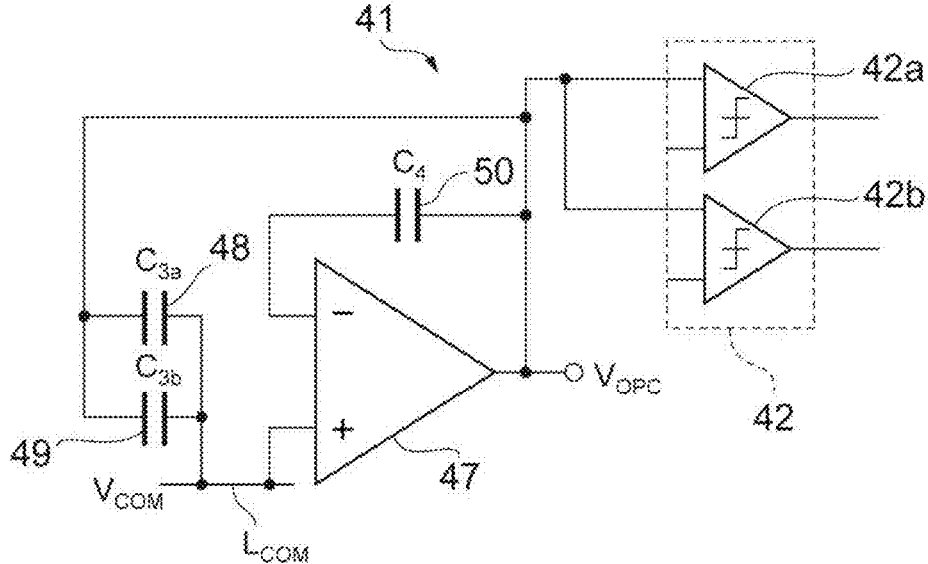

A/D CONVERTER

CROSS-REFERENCE TO RELATED APPLICATIONS

The present application is a 35 U.S.C. §§ 371 national phase conversion of PCT/JP2017/040436, filed Nov. 9, 2017, which claims priority to Japanese Patent Application No. 2016-220644, filed Nov. 11, 2016, the contents of both of which are incorporated herein by reference. The PCT International Application was published in the Japanese language.

TECHNICAL FIELD

The present disclosure relates to an A/D converter that converts a signal from an image sensor into a digital value.

BACKGROUND ART

An A/D converter converts an output signal of an image sensor into a multi-bit digital value. In the related art, an A/D converter is used for an image sensor. For example, Patent Literature 1 discloses an A/D converter. The A/D converter of Patent Literature 1 includes a cyclic A/D conversion circuit that receives an analog signal from a column of an image sensor and generates digital values and computation values of upper bits, and a cyclic A/D conversion circuit that receives the computation value (a residual value) and generates digital values of lower bits.

CITATION LIST

Patent Literature

[Patent Literature 1] Japanese Patent No. 5769178

SUMMARY OF INVENTION

Technical Problem

In recent years, with improvements in image quality of images and the like, high speed and an improved S/N ratio in an A/D converter have been demanded. According to such demands, in an A/D converter having a configuration of the related art, power consumption tends to increase when high speed and an improved S/N ratio are realized.

The present disclosure has been made in view of the above problem, and an object of present disclosure is to provide an A/D converter capable of realizing high speed and an improved S/N ratio while suppressing power consumption.

Solution to Problem

An aspect of the present invention is an A/D converter disposed in a column of an image sensor and converting a signal from the image sensor into a digital value, the A/D converter including: a front stage A/D conversion unit including a first A/D conversion unit that receives an analog signal from the image sensor and generates a first digital value and a first residual analog signal that is a computation value in a folding integration A/D conversion operation through the folding integration A/D conversion operation, and a second A/D conversion unit that receives a first residual analog signal from the first A/D conversion unit and generates a second digital value and a second residual analog signal that is a computation value in a cyclic A/D conversion operation through the cyclic A/D conversion operation; and a rear stage A/D conversion unit that receives the second residual analog signal from the front stage A/D conversion unit and generates a third digital value through an acyclic A/D conversion operation.

According to the A/D converter of the aspect, the first A/D conversion unit, to which an analog value is input, generates the first digital value and the first residual analog signal. Then, the second A/D conversion unit, to which the first residual analog signal is input, further generates the second digital value and the second residual analog signal. The rear stage A/D conversion unit to which the second residual analog signal is input generates the third digital value. According to such a configuration, in the A/D converter that obtains digital values through a plurality of A/D conversion operations, the folding integration A/D conversion operation is first performed. In the folding integration A/D conversion operation, the integration operation is performed N times. As a result, a signal component of the image sensor is N-folded. On the other hand, in the folding integration A/D conversion operation, a random noise component is √N-folded (a square root of N). Therefore, an S/N ratio in the image sensor signal is improved $\sqrt{N}$-fold. For this reason, the random noise can be reduced. Further, accuracy required for the second A/D conversion unit included in the front stage A/D conversion unit can be lowered as compared with the first A/D conversion unit. Therefore, total power consumption of the front stage A/D conversion unit can be reduced. Further, the rear stage A/D conversion unit performs an A/D conversion operation using an acyclic A/D conversion operation. Therefore, the rear stage A/D conversion unit can further reduce power consumption. In addition, in the front stage A/D conversion unit, accuracy required for an A/D conversion circuit of the second A/D conversion unit can be lower as compared with that of the first A/D conversion unit. Therefore, it is possible to realize a high-speed A/D conversion operation. As a result, it is possible to provide the A/D converter capable of realizing high speed and noise reduction while suppressing an increase in power consumption.

The first A/D conversion unit may include a first circuit that performs the folding integration A/D conversion operation, the first circuit may include a first gain stage including a first input that receives the analog signal, a first front stage capacitor that is able to be connected to the first input, a first operational amplifier including an inverting input that is able to be connected to the first front stage capacitor, a first output connected to an output of the first operational amplifier, and a first feedback capacitor that is able to be connected between the inverting input and an output of the first operational amplifier, and the folding integration A/D conversion operation may include a first storage operation in which the first front stage capacitor stores the analog signal, and a first computation operation in which the first gain stage generates the first residual analog signal that is a computation value. In the first storage operation, the first front stage capacitor may be connected to the first input, and the first feedback capacitor may be connected between the output and the inverting input of the first operational amplifier. In the first computation operation, the first front stage capacitor may be connected to the inverting input of the first operational amplifier, and the first feedback capacitor may be connected between the output and the inverting input of the first operational amplifier. The second A/D conversion unit may include at least one second circuit that performs the cyclic A/D conversion operation, the second circuit may include a second gain stage including a second input that receives the first residual analog signal or the second residual analog signal, a second front stage capacitor that is able to be connected to the second input, a second operational amplifier including an inverting input that is able to be connected to the second front stage capacitor, a second output connected to an output of the second operational amplifier, and a second feedback capacitor that is able to be connected between the inverting input and the output of the second operational amplifier, and the cyclic A/D conversion operation may include a second storage operation in which the second front stage capacitor stores the first residual analog signal or the second residual analog signal, and a second computation operation in which the second gain stage generates the second residual analog signal that is a computation value. In the second storage operation, the second front stage capacitor may be connected to the second input or the output of the second operational amplifier, and the second feedback capacitor may be connected between the second input or the output of the second operational amplifier and the inverting input of the second operational amplifier. In the second computation operation, the second front stage capacitor may be connected to the second operational amplifier, and the second feedback capacitor may be connected between the output and the inverting input of the second operational amplifier.

According to this configuration, the first circuit of the first A/D conversion unit is a circuit physically separate from the second circuit of the second A/D conversion unit. Therefore, pipeline processing can be applied when the folding integration A/D conversion operation in the first A/D conversion unit and the cyclic A/D conversion operation in the second A/D conversion unit are executed. Therefore, it is possible to realize a high-speed A/D conversion operation. Further, according to the pipeline processing, it is possible to secure a longer time that can be assigned to the folding integration A/D conversion operation in the first A/D conversion unit. Therefore, it is possible to increase the number of repetitions of the integration operation. Therefore, it is possible to further enhance the S/N ratio.

The front stage A/D conversion unit may include a third circuit that is able to be switched between a circuit that performs the folding integration A/D conversion operation and a circuit that performs the cyclic A/D conversion operation by controlling a plurality of switches, the third circuit may include a common gain stage including a common input that receives the analog signal or the first residual analog signal, a common front stage capacitor that is able to be connected to the common input, a common operational amplifier including an inverting input that is able to be connected to the common front stage capacitor, a common output connected to an output of the common operational amplifier, and a common feedback capacitor that is able to be connected between the inverting input and an output of the common operational amplifier, and the folding integration A/D conversion operation may include a first storage operation in which the common front stage capacitor stores the analog signal and a first computation operation in which the common gain stage generates the first residual analog signal that is a computation value. In the first storage operation, the common front stage capacitor may be connected to the common input, and the common feedback capacitor may be connected between the output and the inverting input of the common operational amplifier. In the first computation operation, the common front stage capacitor may be connected to the common operational amplifier, and the common feedback capacitor may be connected between the output and the inverting input of the common operational amplifier. The cyclic A/D conversion operation may include a second storage operation in which the common front stage capacitor stores the first residual analog signal or the second residual analog signal, and a second computation operation in which the common gain stage generates the second residual analog signal that is a computation value. In the second storage operation, the common front stage capacitor may be connected to the common input or the output of the common operational amplifier, and the common feedback capacitor may be connected between the common input or the output of the common operational amplifier and the inverting input of the common operational amplifier, and in the second computation operation, the common front stage capacitor may be connected to the common operational amplifier, and the common feedback capacitor may be connected between the output and the inverting input of the common operational amplifier.

According to this configuration, the first A/D conversion unit and the second A/D conversion unit in the front stage A/D conversion unit are realized by a common circuit. Therefore, it is possible to reduce a circuit area of the front stage A/D conversion unit.

The rear stage A/D conversion unit may be a successive comparison A/D conversion circuit that includes a comparator that compares the second residual analog signal that is a computation value from the front stage A/D conversion unit with a successively changing reference voltage, the successive comparison A/D conversion circuit successively generating the third digital value on the basis of an output of the comparator. According to such a configuration, it is possible to further reduce power consumption of the rear stage A/D conversion unit.

The A/D converter may further include a timing control unit that controls the first storage operation, the first computation operation, the second storage operation, and the second computation operation, wherein the timing control unit may perform control so that a timing at which switching between the first storage operation and the first computation operation is performed is excluded from an end period of the second storage operation and an end period of the second computation operation. The operation of the first circuit may cause noise. According to such a configuration, it is possible to suppress an influence of the noise on the operation of the second circuit. Therefore, it is possible to suppress a decrease in accuracy of the second digital value output from the second circuit. Further, it is possible to suppress a decrease in accuracy of the second residual analog signal.

The A/D converter may further include a timing control unit that controls the second storage operation and the second computation operation, wherein the second A/D conversion unit may include at least two second circuits, and the timing control unit may perform control so that a timing at which switching between the second storage operation and the second computation operation of the second circuit in one of the at least two second circuits is performed is excluded from an end period of the second storage operation and an end period of the second computation operation in the other of the at least two second circuits. Further, the A/D converter may further include a timing control unit that controls the second storage operation and the second computation operation, wherein the front stage A/D conversion unit may include at least two third circuits, and the timing control unit may perform control so that a timing at which switching between the second storage operation and the second computation operation of the third circuit in one of the at least two third circuits is performed is excluded from an end period of the second storage operation and an end period of the second computation operation in the other of the at least two third circuits. The operation of one second circuit may cause noise. According to such a configuration, it is possible to suppress an influence of the noise on the operation of the other second circuit. Therefore, it is possible to suppress a decrease in accuracy of the second digital value output from the second circuit. Further, it is possible to suppress a decrease in accuracy of the second residual analog signal.

The A/D converter may further include a timing control unit that controls the first storage operation and the first computation operation, and controls a comparison operation of comparing the second residual analog signal with the reference voltage in the rear stage A/D conversion unit, wherein the timing control unit may perform control so that a timing of the comparison operation is excluded from an end period of the first storage operation and an end period of the first computation operation. The operation of the first circuit may cause noise. According to such a configuration, it is possible to suppress an influence of the noise on the operation of the third circuit. Therefore, it is possible to suppress a decrease in accuracy of the third digital value output from the third circuit.

The A/D converter may further include a timing control unit that controls the second storage operation and the second computation operation, and controls a comparison operation of comparing the second residual analog signal with the reference voltage in the rear stage A/D conversion unit, wherein the timing control unit may perform control so that a timing of the comparison operation is excluded from an end period of the second storage operation and an end period of the second computation operation. The operation of the second circuit may cause noise. According to such a configuration, it is possible to suppress an influence of the noise on the operation of the third circuit. Therefore, it is possible to suppress a decrease in accuracy of the third digital value output from the third circuit.

Advantageous Effects of Invention

According to the A/D converter according to an aspect of the present disclosure, it is possible to realize high speed and an improved S/N ratio while suppressing power consumption.

BRIEF DESCRIPTION OF DRAWINGS

FIGS. 7(*a*), 7(*b*), and 7(*c*) are circuit diagrams illustrating a second A/D conversion operation.

DESCRIPTION OF EMBODIMENTS

Figure 1:
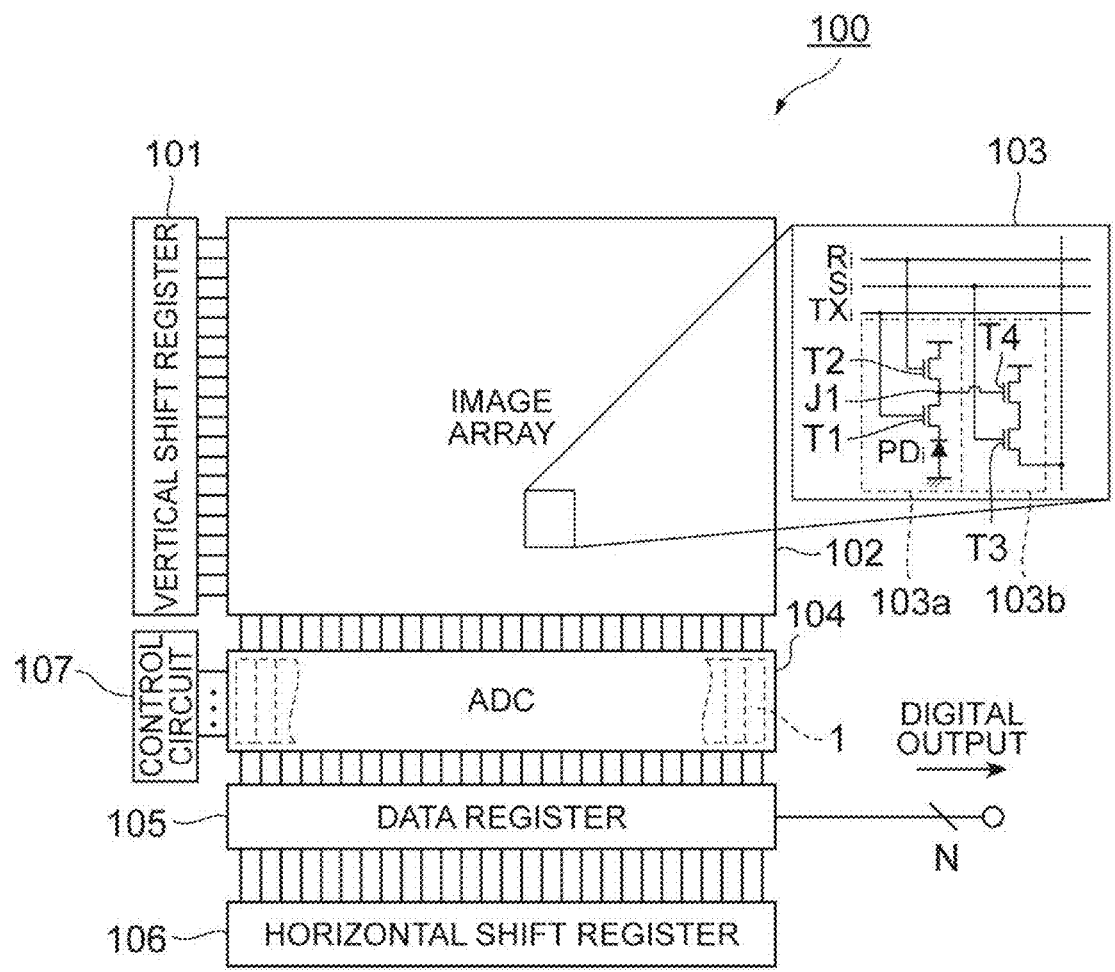
FIG. 1 is a diagram illustrating a circuit block of a CMOS image sensor having an A/D converter according to an embodiment.

Hereinafter, modes for carrying out the present disclosure will be described in detail with reference to the accompanying drawings. In the description of the drawings, the same elements are denoted by the same reference numerals. Further, repeated description will be omitted.

A configuration of a CMOS image sensor will be described with reference to FIG. 1. The CMOS image sensor includes an A/D converter according to an embodiment.

FIG. 1 illustrates a circuit block of a CMOS image sensor 100. The CMOS image sensor 100 includes an A/D converter 1 according to the embodiment. The CMOS image sensor 100 includes a vertical shift register 101, an image array 102, a pixel 103, an array 104, a data register 105, a horizontal shift register 106, and a control circuit 107. The vertical shift register 101 provides control signals $R_i$, $S_i$, and $TX_i$. The control signals $R_i$, $S_i$, and $TX_i$ are provided to the pixels 103 constituting the image array 102. Further, the vertical shift register 101 transmits a signal based on photocharge obtained in each pixel 103 to the array 104 of the A/D converter 1. The array 104 includes a plurality of A/D converters 1. In addition, the array 104 processes the output signal of each pixel 103 in parallel. The control circuit 107 is connected in parallel to the plurality of A/D converters 1. Further, the control circuit 107 provides a control signal for controlling timings of various operations of the A/D converter 1. An A/D conversion result is stored in the data register 105. The A/D conversion result is read by horizontal scanning after A/D conversion. The horizontal scanning is in accordance with a control signal output from the horizontal shift register 106.

The A/D converter 1 is connected to the image array 102. The image array 102 includes the pixels 103 arranged in a matrix form. Each pixel 103 includes a photodiode $PD_i$, a sensor circuit 103*a*, and an amplifier 103*b*. The amplifier 103*b* amplifies a sensor signal that is provided from the sensor circuit 103*a*. The pixel 103 receives a reset signal to initialize an internal state. After this initialization, the pixel 103 provides an electrical signal to the array 104. The electrical signal corresponds to the light received by the photodiode $PD_i$. Further, the electric signal includes a significant signal component and a noise component such as reset noise. Each pixel 103 includes the photodiode $PD_i$ for converting light into charge, and several MOS transistors T1, T2, T3, and T4. Further, the transistor T1 according to the control signal $TX_i$ controls movement of charge. The transistor T2 according to a control signal $R_i$ controls initialization of charge. The transistor T3 according to a control signal $S_i$ controls selection of the pixel. The transistor T4 responds to a potential at a connection point J1 between the transistor T1 and the transistor T2. Each pixel 103 generates reset noise in response to a reset operation. Further, an output voltage of each pixel 103 includes fixed pattern noise unique to the pixel. The random noise is generated by, for example, an element connected to the input of the A/D converter 1. An output signal of the pixel 103 includes a signal at a first signal level including a noise component, and a signal at a second signal level including a signal component superimposed on the noise component. The output signal of the pixel 103 is provided to the array 104 via a signal line connected to the amplifier 103b. The A/D converter 1 executes correlated double sampling. Through this operation, the A/D converter 1 removes a component at a reset level from the output signal of the pixel 103. Thereafter, the A/D converter 1 performs an A/D conversion operation.

Figure 2:
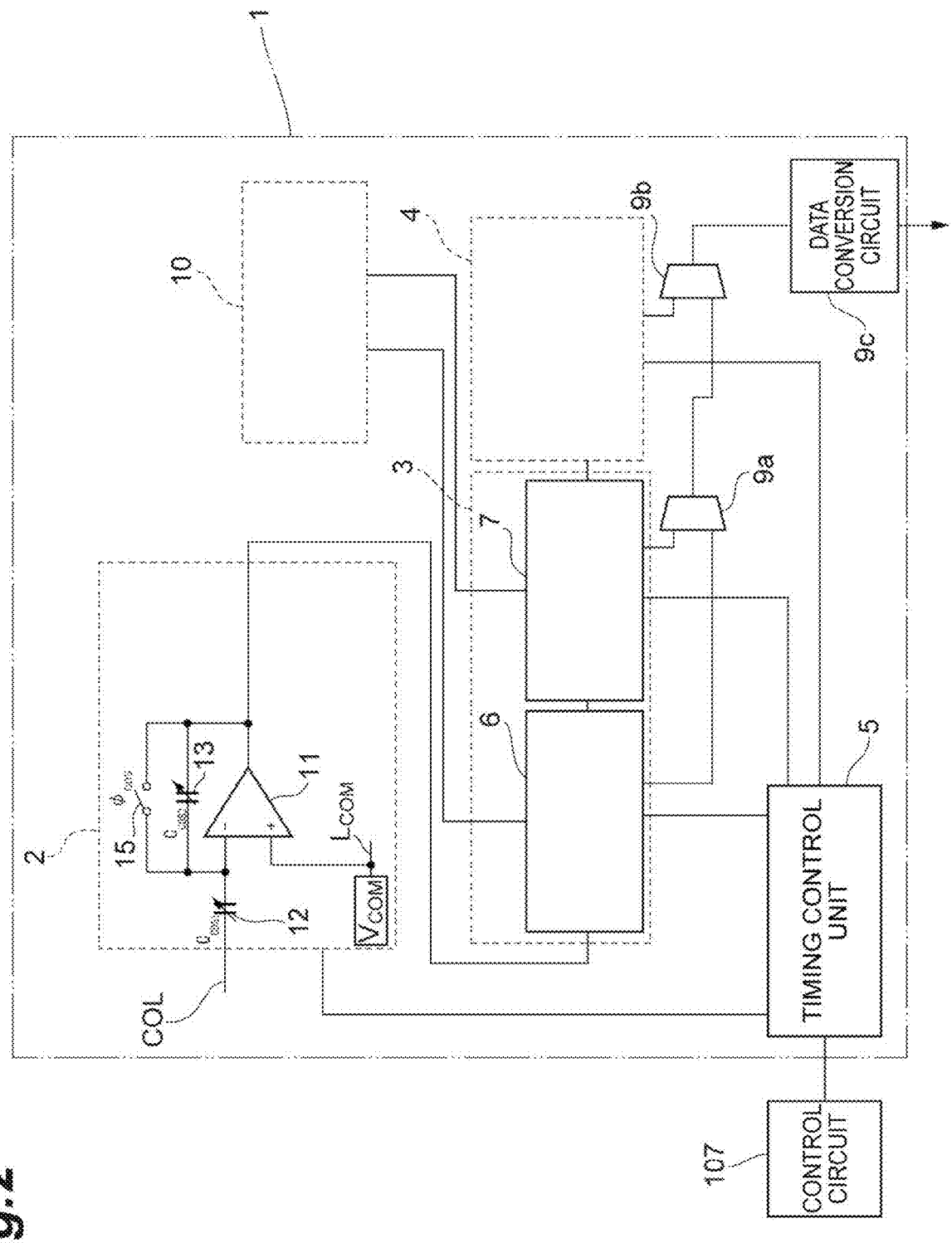
FIG. 2 is a diagram schematically illustrating a circuit block of the A/D converter.

A schematic configuration of the A/D converter 1 will be described. FIG. 2 schematically illustrates a circuit block of the A/D converter 1. The A/D converter 1 converts an output signal of the CMOS image sensor 100 into digital values of Na+Nb+Nc=Nt bits (Na, Nb, and Nc are integers equal to or greater than 2). A one-dimensional array of the A/D converters 1 is arranged in a column of the CMOS image sensor 100. The A/D converters 1 constituting the one-dimensional array are connected to a column line COL of the CMOS image sensor 100. The A/D converter 1 processes an output signal of the amplifier 103b (see FIG. 1) of the pixel 103 connected to the column line COL. The A/D converter 1 is not limited to a configuration in which the A/D converter 1 is connected to one column of the CMOS image sensor 100. One A/D converter 1 may be connected to a plurality of columns. A plurality of A/D converters 1 may be connected to one column. The A/D converter 1 includes a correlated double sampling circuit (hereinafter referred to as a "CDS circuit 2"), a front stage A/D conversion unit 3, a rear stage A/D conversion unit 4, a timing control unit 5, and a reference voltage generation unit 10. The front stage A/D conversion unit 3 has a first A/D conversion unit 6 (a first circuit) and a second A/D conversion unit 7 (a second circuit).

The CDS circuit 2 is connected to the image array 102 and the first A/D conversion unit 6. The CDS circuit 2 is connected to the image array 102 by the column line COL. The CDS circuit 2 generates an input value $V_{IN}$. The input value $V_{IN}$ is a value obtained by removing the component of the reset level from the signal level provided from the pixel 103. In other words, the CDS circuit 2 performs offset adjustment of the signal level with reference to a criterion potential $V_{COM}$. According to the offset adjustment, a range of the input value $V_{IN}$ can fall within a range that can be received by the first A/D conversion unit 6. Therefore, it is possible to suppress degradation of accuracy of an A/D conversion operation caused by saturation of the input value $V_{IN}$. The first A/D conversion unit 6 receives the input value $V_{IN}$ from the column line COL via the CDS circuit 2. The input value $V_{IN}$ is an analog signal. Further, the first A/D conversion unit 6 generates a first digital value D1 and a first residual analog signal $V_{OPF}$. The first digital value D1 includes Na bits at a high level indicating an analog signal. The second A/D conversion unit 7 receives the first residual analog signal from the first A/D conversion unit 6. The second A/D conversion unit 7 generates a second digital value D2 and a second residual analog signal $V_{OPC}$. The second digital value D2 includes Nb bits at a medium level indicating the first residual analog signal $V_{OPF}$. The rear stage A/D conversion unit 4 receives the second residual analog signal $V_{OPC}$ from the second A/D conversion unit 7. The rear stage A/D conversion unit 4 generates a third digital value D3. The third digital value D3 is Nc lower bits indicating the second residual analog signal $V_{OPC}$.

The numbers of bits Na, Nb, and Nc can take various values. Accuracy required of the rear stage A/D conversion unit may be lower than the accuracy required of the front stage A/D conversion unit. Therefore, it is possible to reduce total power consumption by increasing the number of bits of the digital value generated by the A/D conversion unit on the rear stage side. For example, the numbers of bits may be Na=3, Nb=6, and Nc=3. The first digital value D1 generated by the first A/D conversion unit 6, the second digital value D2 generated by the second A/D conversion unit 7, and the third digital value D3 generated by the rear stage A/D conversion unit 4 are output to the data register 105 (see FIG. 1) via the data conversion circuits 9a, 9b, and 9c. The data conversion circuit 9a combines the first digital value D1 output from the first A/D conversion unit 6 with the second digital value D2 output from the second A/D conversion unit 7. The data conversion circuit 9a outputs the combination value to the data conversion circuit 9b. The data conversion circuit 9b combines the first digital value D1 and the second digital value D2 with the third digital value D3 output from the rear stage A/D conversion unit 4. The data conversion circuit 9b outputs a combination value to the data conversion circuit 9c. The data conversion circuit 9c converts a digital value in a redundant representation into a non-redundant representation. The digital value of the redundant representation is included in the digital value output from the data conversion circuit 9b. The data conversion circuit 9c outputs the digital value converted into the non-redundant representation. In the embodiment, the first digital value D1 output from the first A/D conversion unit 6 and the second digital value D2 output from the second A/D conversion unit 7 are redundant representations having three values. Thus, the digital values are converted to non-redundant representations and are output.

The timing control unit 5 receives a control signal from the control circuit 107. The timing control unit 5 provides the control signal to the first A/D conversion unit 6, the second A/D conversion unit 7, and the rear stage A/D conversion unit 4. Details of the timing control unit 5 will be described below.

The CDS circuit 2 includes an operational amplifier 11, capacitors 12 and 13, and a switch 15. The capacitor 12 is connected to the column line COL and is connected to an inverting input of the operational amplifier 11. The capacitor 13 is connected to the inverting input of the operational amplifier 11 and is connected to an output of the operational amplifier 11. The switch 15 is connected to the inverting input of the operational amplifier 11 and is connected to the output of the operational amplifier 11. A non-inverting input of the operational amplifier is connected to a criterion potential line $L_{COM}$. The non-inverting input of the operational amplifier receives the criterion potential $V_{COM}$.

In the CDS circuit 2, the inverting input of the operational amplifier 11 is connected to the output by the switch 15. Through this connection, the CDS circuit 2 holds a reset level $V_R$ in the capacitor 12. Thereafter, the CDS circuit 2 turns off the switch 15. Through these operations, the CDS circuit 2 generates the input value $V_{IN}$. The input value $V_{IN}$ is a difference between the signal level and the reset level.

The reference voltage generation unit 10 generates a first conversion reference voltage $V_{RCH}$. Further, the reference voltage generation unit 10 generates a second conversion reference voltage $V_{RCL}$. The first conversion reference voltage $V_{RCH}$ is provided to a sub A/D conversion circuit 22 (see FIG. 4) of the first A/D conversion unit 6. The second conversion reference voltage $V_{RCL}$ is provided to a sub A/D conversion circuit 42 (see FIG. 6) of the second A/D conversion unit 7. The reference voltage generation unit 10 provides the first conversion reference voltage $V_{RCH}$ to a comparator 22a (see FIG. 4) of the sub A/D conversion circuit 22. The reference voltage generation unit 10 provides the first conversion reference voltage $V_{RCH}$ to a comparator 42a of the sub A/D conversion circuit 42 (see FIG. 4). In addition, the reference voltage generation unit 10 provides the second conversion reference voltage $V_{RCL}$ to the comparator 42b.

Figure 3:
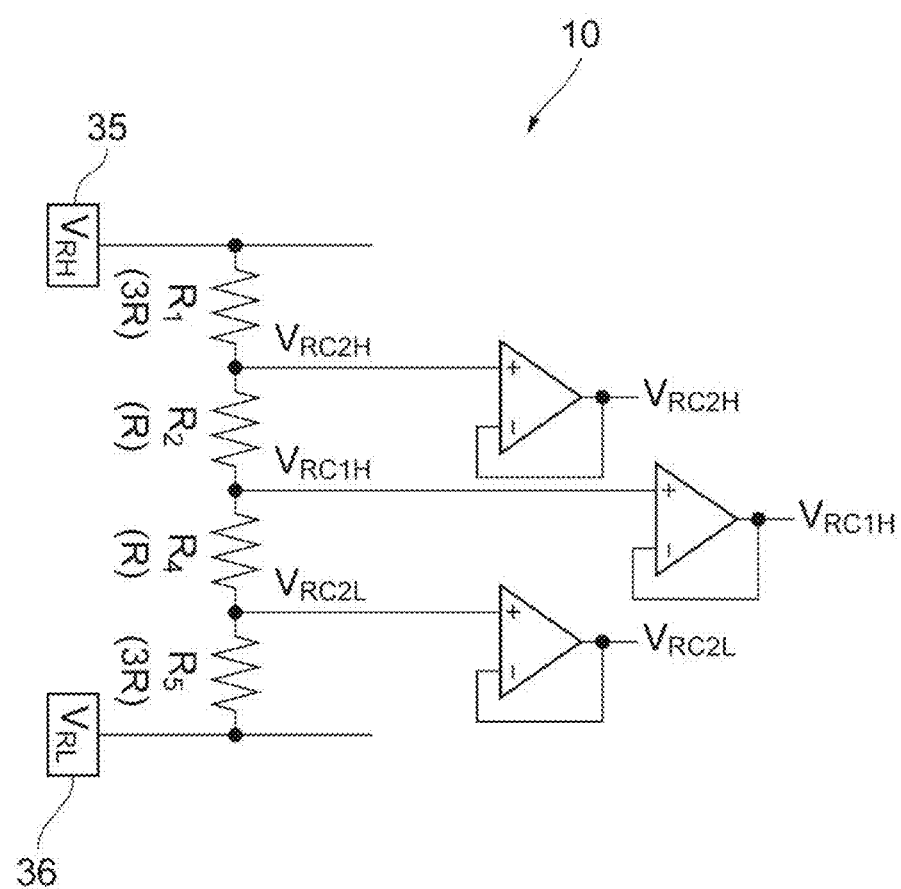
FIG. 3 is a circuit diagram of a reference voltage generation unit.

As illustrated in FIG. 3, the reference voltage generation unit 10 generates the first conversion reference voltage $V_{RCH}$ on the basis of a first criterion reference voltage $V_{RH}$. Further, the reference voltage generation unit 10 generates the second conversion reference voltage $V_{RCL}$ on the basis of a second criterion reference voltage $V_{RL}$. It should be noted that the first criterion reference voltage $V_{RH}$ is provided from a criterion voltage source 35. Further, the second criterion reference voltage $V_{RL}$ is provided from a criterion voltage source 36.

The reference voltage generation unit 10 illustrated in FIG. 3 provides a voltage $V_{RC1H}$ as the first conversion reference voltage $V_{RCH}$ when the first A/D conversion unit 6 performs a folding integration A/D conversion operation. On the other hand, when the second A/D conversion unit 7 performs the cyclic A/D conversion operation, the reference voltage generation unit 10 provides the voltage $V_{RC2H}$ as the first conversion reference voltage $V_{RCH}$. Further, the reference voltage generation unit 10 provides a voltage $V_{RC2L}$ as the second conversion reference voltage $V_{RCL}$ when the second A/D conversion unit 7 performs the cyclic A/D conversion operation.

When the folding integration A/D conversion operation is performed, the first conversion reference voltage $V_{RCH}$ provided by the reference voltage generation unit 10 is a median value between the first criterion reference voltage $V_{RH}$ and the second criterion reference voltage $V_{RL}$. Further, when the cyclic A/D conversion operation is performed, the first conversion reference voltage $V_{RCH}$ provided by the reference voltage generation unit 10 is the voltage $V_{RC2H}$ expressed by the following equation. Further, when the cyclic A/D conversion operation is performed, the second conversion reference voltage $V_{RCL}$ provided by the reference voltage generation unit 10 is the voltage $V_{RC2L}$ expressed by the following equation.

$$V_{RC2H}=(5V_{RH}+3V_{RL})/8$$

$$V_{RC2L}=(3V_{RH}+5V_{RL})/8$$

Figure 4:
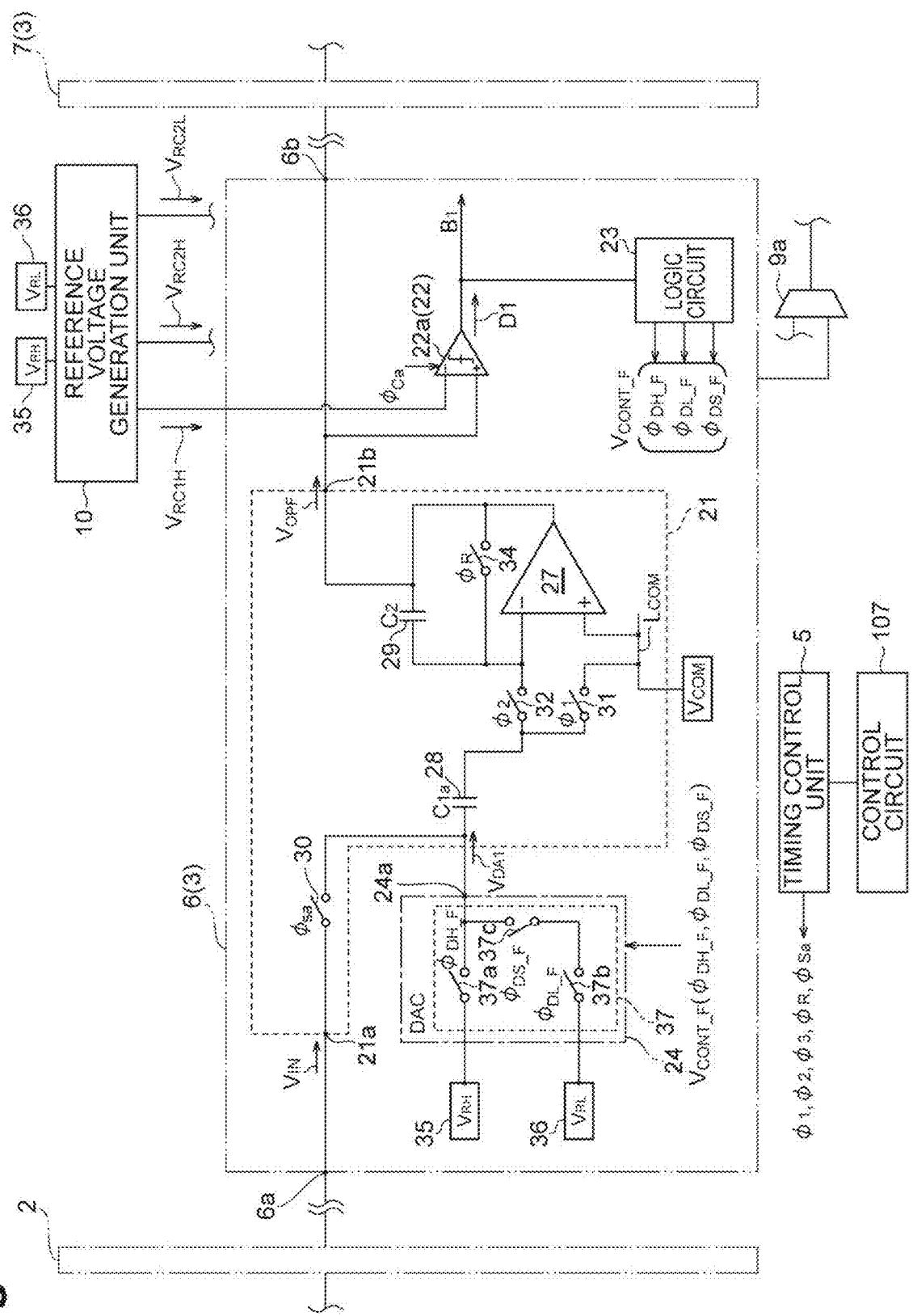
FIG. 4 is a circuit diagram of a first A/D conversion unit.

FIG. 4 is a circuit diagram of the first A/D conversion unit 6. The first A/D conversion unit 6 performs a so-called folding integration (FI) A/D conversion operation. The first A/D conversion unit 6 includes an input 6a (a first input), an output 6b (a first output), a gain stage 21 (a first gain stage), a sub A/D conversion circuit 22, a logic circuit 23, and a D/A conversion circuit 24.

The gain stage 21 performs a computation operation and a storage operation. The gain stage 21 includes an input 21a, an output 21b, a single-ended operational amplifier 27 (a first operational amplifier), and capacitors 28 and 29. The input 21a receives the input value $V_{IN}$ from the input 6a. The input value $V_{IN}$ is an analog signal that is converted to a digital value. The output 21b provides the first residual analog signal $V_{OPF}$, which is a computation value, to the output 6b. The gain stage 21 generates the first residual analog signal $V_{OPF}$ using the operational amplifier 27 and the capacitors 28 and 29 when performing the computation operation. The gain stage 21 holds the input value $V_{IN}$ in the capacitors 28 and 29 when performing the storage operation.

The operational amplifier 27 has an inverting input, a non-inverting input, and an output. A phase of a signal provided from the output of the operational amplifier 27 is inverted with respect to a phase of a signal applied to the inverting input. The non-inverting input of the operational amplifier 27 is connected to the criterion potential line $L_{COM}$. Therefore, the non-inverting input of the operational amplifier 27 receives the criterion potential $V_{COM}$.

The capacitors 28 and 29 are capacitances for storing and computing various signal values. The capacitor 28 that is a first front stage capacitor can be connected to the input 21a and the inverting input of the operational amplifier 27. The capacitor 29 that is a first feedback capacitor is connected to the output of the operational amplifier 27 and connected to the inverting input of the operational amplifier 27.

Capacitance $C_2$ of the capacitor 29 is greater than capacitance $C_{1a}$ of the capacitor 28. According to such capacitance $C_{1a}$, the input value $V_{IN}$ is attenuated on the basis of a capacitance ratio $(C_{1a}/C_2)$. Therefore, a voltage range of the first residual analog signal $V_{OPF}$ decreases according to the capacitance ratio $(C_{1a}/C_2)$. The first residual analog signal $V_{OPF}$ is an output value of the folding integration A/D conversion operation. As one example, the capacitance $C_2$ of the capacitor 29 is twice the capacitance $C_{1a}$ of the capacitor 28. That is, $C_{1a}=\frac{1}{2} \times C_2$. The first A/D conversion unit 6 including such capacitors 28 and 29 attenuates a voltage of the input value $V_{IN}$ to ½. The first A/D conversion unit 6 performs a storage operation and an integration operation using the attenuated input value $V_{IN}$. Therefore, the voltage range of the first residual analog signal $V_{OPF}$ is halved according to the capacitance ratio $(C_{1a}/C_2)$ of the capacitors 28 and 29. Accordingly, the first A/D conversion unit 6 provides an input voltage suitable for the second A/D conversion unit 7 having a single end configuration to the second A/D conversion unit 7 that performs a cyclic A/D conversion operation.

The gain stage 21 includes a plurality of switches 30, 31, 32, and 34. The switch 30 connects the input 21a to one terminal of the capacitor 28. The switch 31 connects the other terminal of the capacitor 28 to the criterion potential line $L_{COM}$. The switch 32 connects the other terminal of the capacitor 28 to the inverting input of the operational amplifier 27. The switch 34 connects the output of the operational amplifier 27 to the inverting input. It should be noted that the disposition of the switches 30, 31, 32, and 34 illustrated in FIG. 4 is an example. The switches 30, 31, 32, and 34 are controlled by control signals $\phi_1$, $\phi_2$, $\phi_3$, $\phi_R$, and $\phi_{Sa}$ generated in the timing control unit 5.

The sub A/D conversion circuit 22 generates the first digital value D1 according to the first conversion reference voltage $V_{RCH}$ on the basis of the first residual analog signal $V_{OPF}$. The first residual analog signal $V_{OPF}$ is a computation value provided from the output 21b of the gain stage 21. The sub A/D conversion circuit 22 includes, for example, the comparator 22a. An output of the comparator 22a is connected to at least the logic circuit 23.

The sub A/D conversion circuit 22 generates the first digital value D1 including one bit using the comparator 22a. The comparator 22a compares the first residual analog signal $V_{OPF}$ with the first conversion reference voltage $V_{RCH}$. As a result of the comparison, the comparator 22a generates a bit (B1) that is a comparison result signal according to the following equations.

$$B1=1 \text{ when } V_{OPF} \geq V_{RCH}$$

B1=0 when $V_{OPF} < V_{RCH}$

The logic circuit 23 generates a control signal $V_{CONT\_F}$ according to the first digital value D1. The control signal $V_{CONT\_F}$ includes, for example, $\phi_{DH\_F}$, $\phi_{DL\_F}$, and $\phi_{DS\_F}$. The logic circuit 23 is connected to the output of the comparator 22a and to the D/A conversion circuit 24. The logic circuit 23 provides the control signal $V_{CONT\_F}$ to the D/A conversion circuit 24.

The D/A conversion circuit 24 provides at least one of the first criterion reference voltage $V_{RH}$ and the second criterion reference voltage $V_{RL}$ to the gain stage 21. Selection of the first criterion reference voltage $V_{RH}$ and the second criterion reference voltage $V_{RL}$ is based on the control signal $V_{CONT\_F}$. The D/A conversion circuit 24 is connected to the criterion voltage sources 35 and 36. The criterion voltage source 35 provides the first criterion reference voltage $V_{RH}$. The criterion voltage source 36 provides the second criterion reference voltage $V_{RL}$.

An output voltage of the D/A conversion circuit 24 is $V_{DA1}$. The D/A conversion circuit 24 operates as follows in response to the control signal $V_{CONT\_F}$. The control signal $V_{CONT\_F}$ is based on the first digital value D1 from the sub A/D conversion circuit 22.

$V_{DA1}=V_{RH}$ when a condition (D=1) is satisfied $V_{DA1}=V_{RL}$ when a condition (D=0) is satisfied.

The D/A conversion circuit 24 includes an output 24a and a switch circuit 37. The output 24a is connected to one terminal of the capacitor 28. The switch circuit 37 includes switches 37a, 37b and 37c. In the switch circuit 37, the switch 37a is turned on and the switches 37b and 37c are turned off. With this connection configuration, the switch circuit 37 provides the first criterion reference voltage $V_{RH}$ to the output 24a. Further, in the switch circuit 37, the switch 37a is turned off and the switches 37b and 37c are turned on. With this connection configuration, the switch circuit 37 provides the second criterion reference voltage $V_{RL}$ to the output 24a.

An operation of switch circuit 37 follows the control signal $V_{CONT\_F}$. Specifically, opening and closing operations of the switches 37a, 37b, and 37c are controlled by the control signals $\phi_{DH\_F}$, $\phi_{DL\_F}$, and $\phi_{DS\_F}$ provided from the logic circuit 23, respectively. Accordingly, the first digital value D1 determines the control signals $\phi_{DH\_F}$, $\phi_{DL\_F}$, and $\phi_{DS\_F}$ to be operated.

The first A/D conversion operation that is performed by the first A/D conversion unit 6 will be described. The first A/D conversion unit 6 repeatedly performs sampling (storage and sampling) of the input signal and integration (a computation operation) of a sample value. The first A/D conversion operation is a folding integration operation. The folding integration operation is performed to obtain the first digital value D1 from the input value $V_{IN}$ that is an analog signal.

FIGS. 5(a), 5(b), 5(c), and 5(d) are circuit diagrams illustrating the first A/D conversion operation. When the first A/D conversion operation is performed, the sub A/D conversion circuit 22 generates the first digital value D1 using the comparator 22a, as described above.

Figure 5:
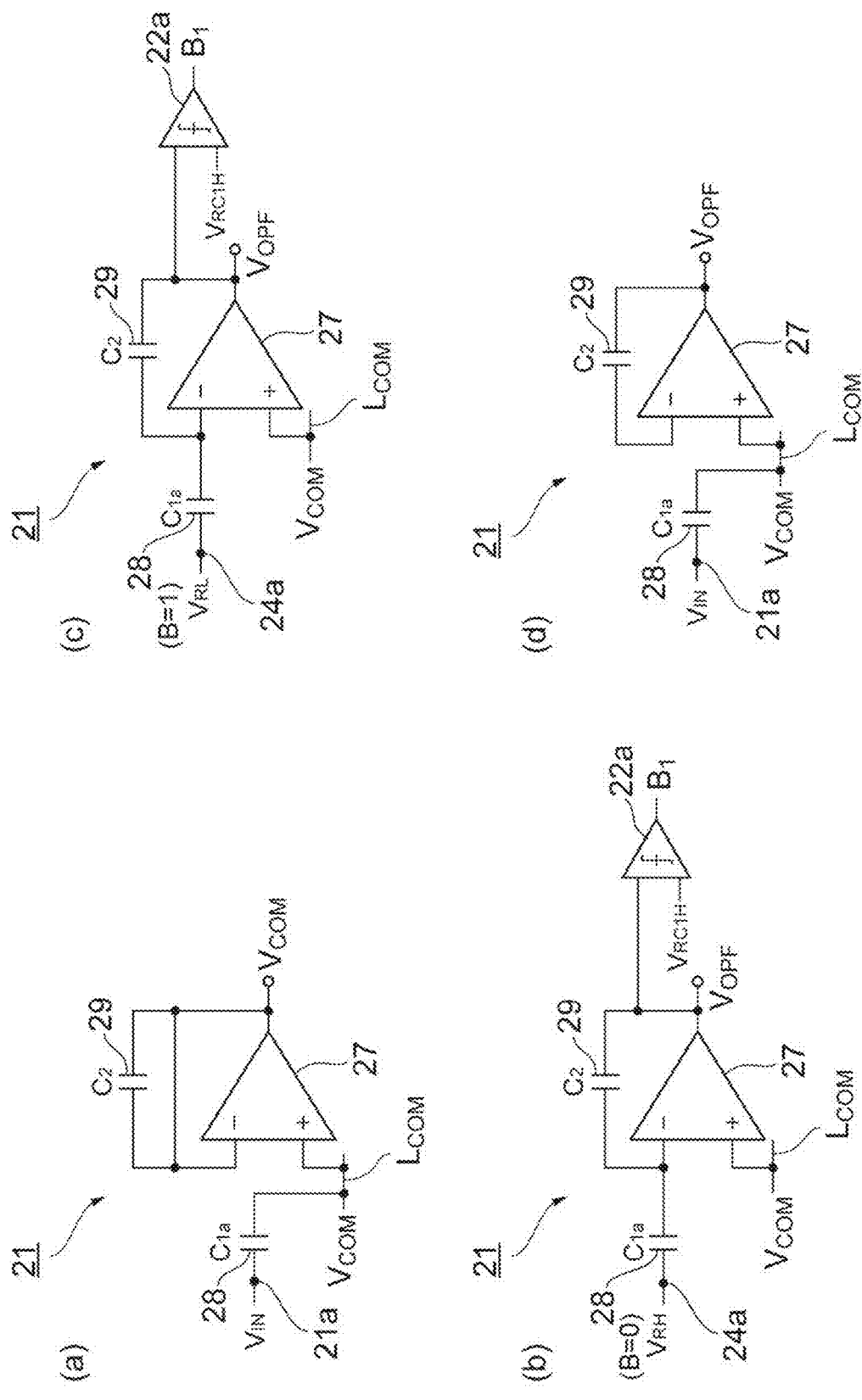
FIGS. 5(*a*), 5(*b*), 5(*c*) and 5(*d*) are circuit diagrams illustrating a first A/D conversion operation.

As illustrated in FIG. 5(a), the gain stage 21 performs a first storage operation as a first initial storage step. In the first initial storage step, the gain stage 21 stores the input value $V_{IN}$ received via the input 21a in the capacitor 28. Specifically, in the gain stage 21, the capacitor 28 is connected to the input 21a and the capacitor 28 is connected to the criterion potential line $L_{COM}$. In the gain stage 21, an output of the operational amplifier 27 is connected to the inverting input.

The circuit configuration is realized by the control signals ($\phi_{DH\_F}$=0, $\phi_{DL\_F}$=0, and $\phi_{DS\_F}$=0) and the control signals ($\phi_1$=1, $\phi_2$=0, $\phi_R$=1, and $\phi_{Sa}$=1). According to these control signals, the switches 31, 34, and 30 are turned on. Further, the switches 37a, 37b, 37c, and 32 are turned off. In this case, charge ($Q_{1a}$) accumulated in the capacitor 28 is expressed by Equation (1) below.

[Math. 1]

$$Q_{1a}=C_{1a}(V_{IN}-V_{COM}) \tag{1}$$

Subsequent to the first initial storage operation step, the first A/D conversion unit 6 performs a first computation operation as a first computation step (see FIG. 5(b) or 5(c)). In the first computation step, the gain stage 21 generates a first residual analog signal $V_{OPF}$ at the output of the operational amplifier 27. Specifically, the gain stage 21 turns off the switch 30. With this configuration, the connection between the input 21a and the capacitor 28 is released. The gain stage 21 turns off the switch 34. With this configuration, the connection between the output of the operational amplifier 27 and the inverting input is released. In the gain stage 21, the capacitor 28 is connected to the output 24a of the D/A conversion circuit 24 and the capacitor 28 is connected to the inverting input of the operational amplifier 27. Further, the gain stage 21 provides the first criterion reference voltage $V_{RH}$ or the second criterion reference voltage $V_{RL}$ to the capacitor 28 according to the first digital value D1 from the comparator 22a.

The circuit configuration is realized by the control signals ($\phi_1$=0, $\phi_2$=1, $\phi_R$=0, and $\phi_{Sa}$=0). According to these control signals, the switch 32 is turned on and the switches 30, 31, and 34 are turned off. Further, when the condition (D=1) is satisfied, the switch 37a is turned on and the switches 37b and 37c are turned off. Accordingly, the first criterion reference voltage $V_{RH}$ is provided to the capacitor 28. On the other hand, when the condition (D=0) is satisfied, the switches 37b and 37c are turned on and the switch 37a is turned off. Accordingly, the second criterion reference voltage $V_{RL}$ is provided to the capacitor 28.

Subsequently, the gain stage 21 performs a first storage operation as a first storage step (see FIG. 5(d)). In the first storage step, a state in which the first residual analog signal $V_{OPF}$ is held in the capacitor 29 is maintained. Further, the input value $V_{IN}$ provided from the input 21a of the gain stage 21 is stored in the capacitor 28. Specifically, in the gain stage 21, the capacitor 28 is connected to the input 21a and the capacitor 28 is connected to the criterion potential line $L_{COM}$. It should be noted that this is different from a circuit configuration of the first initial storage step (see FIG. 5(a)) in that the output of the operational amplifier 27 is not connected to the inverting input. That is, the switch 34 is turned off.

The circuit configuration is realized by the control signals ($\phi_{DH\_F}$=0, $\phi_{DL\_F}$=0, and $\phi_{DS\_F}$=0) and the control signals $\phi_1$=1, $\phi_2$=0, $\phi_R$0, and $\phi_{Sa}$=1). According to these control signals, the switches 31 and 30 are turned on, and the switches 37a, 37b, 37c, 32, and 34 are turned off.

Then, the gain stage 21 repeatedly performs a folding integration A/D conversion step a predetermined number of times. The A/D conversion step includes an n-th first computation step and an n-th first storage step. Further, this A/D conversion step is performed while selecting one of the first computation operations illustrated in FIGS. 5(b) and 5(c) on the basis of the first digital value D1 (n−1). In the folding integration A/D conversion step, when sampling and integration are performed by repeating the first computation step and the first storage step M times, the first residual analog signal $V_{OPF}$ is expressed by Equations (2A) and (2B).

[Math. 2]

$$V_{OPF}(M) = V_{COM} + \frac{M}{2}(V_{IN} - V_{RL}) - \Delta V_R \sum_{i=1}^{M} D1(i) \quad (2A)$$

$$\Delta V_R = \frac{1}{2}(V_{RH} - V_{RL}) \quad (2B)$$

As illustrated in the second term on the right side of Equation (2A), sampling is performed M times in the folding integration A/D conversion operation. This operation includes an operation of multiplying the input value $V_{IN}$, which is an input signal, by a gain of ½. As a result, an amplitude range of an output signal of the A/D conversion (the first residual analog signal $V_{OPF}$) is the same as an amplitude range of the input signal.

Figure 6:
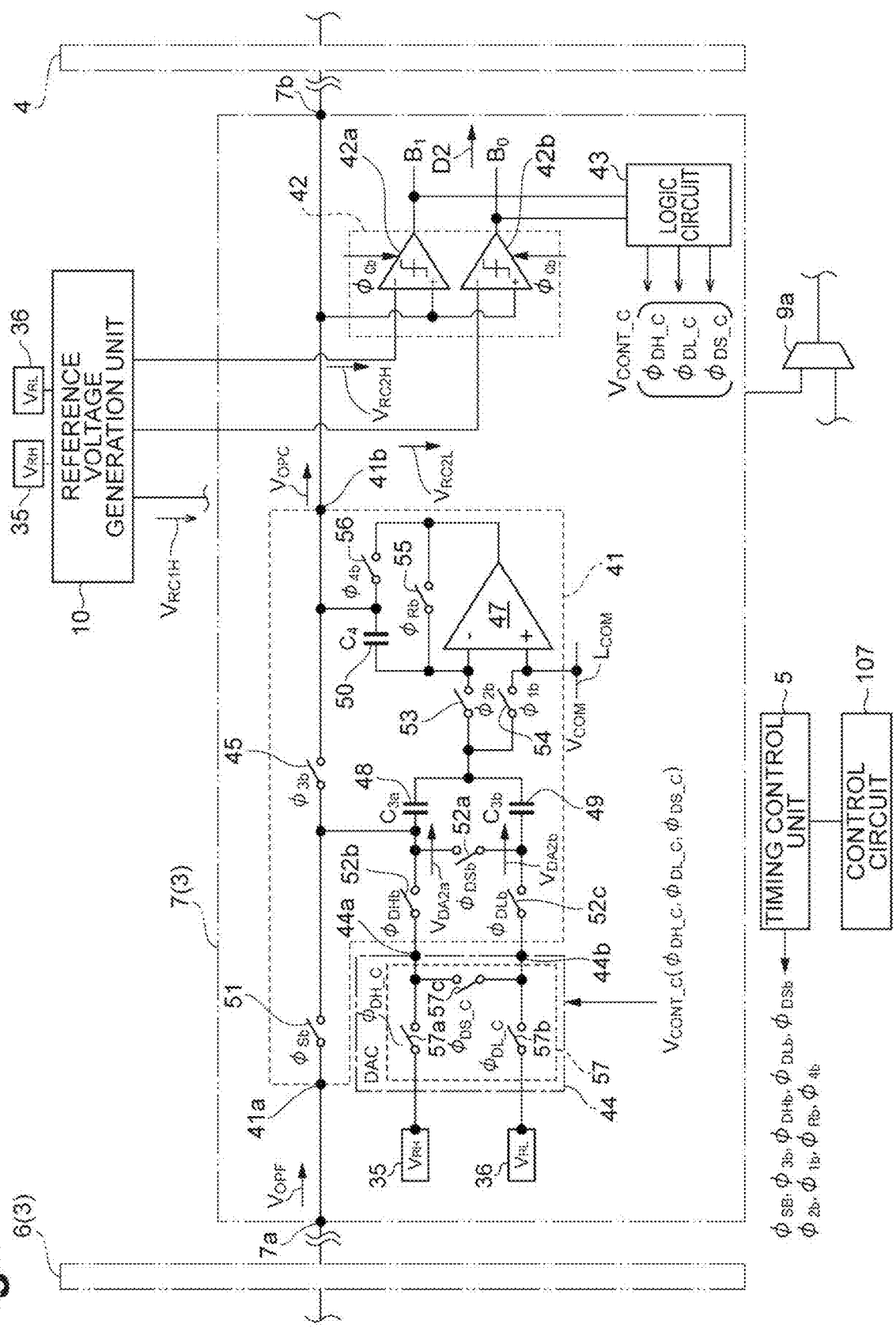
FIG. 6 is a circuit diagram of a second A/D conversion unit.

A configuration of the second A/D conversion unit 7 will be described. FIG. 6 is a circuit diagram of the second A/D conversion unit 7. The second A/D conversion unit 7 performs a so-called cyclic A/D conversion operation. The second A/D conversion unit 7 includes an input 7a (a second input), an output 7b (a second output), a gain stage 41 (a second gain stage), a sub A/D conversion circuit 42, a logic circuit 43, and a D/A conversion circuit 44.

The gain stage 41 performs a computation operation and a storage operation. The gain stage 41 includes an input 41a, an output 41b, a single-ended operational amplifier 47 (a second operational amplifier), and capacitors 48, 49, and 50. The input 41a receives the first residual analog signal $V_{OPF}$ from the first A/D conversion unit 6 via the input 7a. The output 41b provides the second residual analog signal $V_{OPC}$, which is a computation value, to the output 7b. The gain stage 41 generates another second residual analog signal $V_{OPC}$ on the basis of the first residual analog signal $V_{OPF}$ or the second residual analog signal $V_{OPC}$. In the computation operation of the gain stage 41, the gain stage 41 generates the second residual analog signal $V_{OPC}$ on the basis of the operational amplifier 47 and the capacitors 48, 49, and 50. In the storage operation, the first residual analog signal $V_{OPF}$ or the second residual analog signal $V_{OPC}$ is held in the capacitors 48 and 49.

The operational amplifier 47 has an inverting input, a non-inverting input, and an output. A phase of the signal provided from the output of the operational amplifier 47 is inverted with respect to a phase of a signal provided to the inverting input. The non-inverting input of the operational amplifier 47 is connected to the criterion potential line $L_{COM}$. Therefore, the non-inverting input of the operational amplifier 47 receives the criterion potential $V_{COM}$.

The capacitors 48, 49, and 50 are capacitors for a storage operation and a computation operation for various signal values. The capacitors 48 and 49, which are second front stage capacitors, can be connected to the inverting input of the operational amplifier 47 and/or the criterion potential line $L_{COM}$. The capacitor 50, which is a second feedback capacitor, can be connected to the output of the operational amplifier 47 and to the inverting input of the operational amplifier 47.

The gain stage 41 includes a plurality of switches 45, 51, 52a, 52b, 52c, 53, 54, 55, and 56. It should be noted that disposition of the switches 45, 51, 52a, 52b, 52c, 53, 54, 55, and 56 illustrated in FIG. 6 is an example. An opening and closing operation of the switches 45, 51, 52a, 52b, 52c, 53, 54, 55, and 56 follows the control signal generated in the timing control unit 5.

The sub A/D conversion circuit 42 generates the second digital value D2 according to the first conversion reference voltage $V_{RCH}$ and the second conversion reference voltage $V_{RCL}$. This generation operation is based on the first residual analog signal $V_{OPF}$ provided from the input 41a of the gain stage 41. Further, this generation operation is based on the second residual analog signal $V_{OPC}$ provided from the output 41b of the gain stage 41. The sub A/D conversion circuit 42 includes, for example, two comparators 42a and 42b. An output of the comparator 42a is at least connected to the logic circuit 43. The output of the comparator 42b is at least connected to the logic circuit 43.

The sub A/D conversion circuit 42 generates the second digital value D2 of 2 bits using the comparators 42a and 42b. The comparator 42a compares the first residual analog signal $V_{OPF}$ with the first conversion reference voltage $V_{RCH}$. As a result, the comparator 42a provides a comparison result signal B1. Further, the comparator 42a compares the second residual analog signal $V_{OPC}$ with the first conversion reference voltage $V_{RCH}$. As a result, the comparator 42a provides the comparison result signal B1. The comparator 42b compares the first residual analog signal $V_{OPF}$ with the second conversion reference voltage $V_{RCL}$. As a result, the comparator 42b provides a comparison result signal B0. Further, the comparator 42b compares the second residual analog signal $V_{OPC}$ with the second conversion reference voltage $V_{RCL}$. As a result, the comparator 42b provides the comparison result signal B0. The second digital value D2 is, for example, 2 bits (B0, B1). Each bit (B0, B1) of the second digital value D2 has "1" or "0". The second digital value D2 for each cycle has a first value (D2=0), a second value (D2=1), or a third value (D2=2) depending on a combination of the bits (B0, B1). As an example, the sub A/D conversion circuit 42 generates the second digital value D2 according to the following equation.

$D2=0$ when $V_{RCL} > V_{OPC}$ $D2=1$ when $V_{RCH} \geq V_{OPC} \geq V_{RCL}$ $D2=2$ when $V_{OPC} > V_{RCH}$ The sub A/D conversion circuit 42 compares the first residual analog signal $V_{OPF}$, which is an input value of the gain stage 41, with the first conversion reference voltage $V_{RCH}$. Further, the sub A/D conversion circuit 42 compares the first residual analog signal $V_{OPF}$ with the second conversion reference voltage $V_{RCL}$. Further, the sub A/D conversion circuit 42 compares the second residual analog signal $V_{OPC}$, which is a computation value of the gain stage 41, with the first conversion reference voltage $V_{RCH}$. Further, the sub A/D conversion circuit 42 compares the second residual analog signal $V_{OPC}$ with the second conversion reference voltage $V_{RCL}$. The sub A/D conversion circuit 42 generates a redundant code (a 3-value digital signal) through these comparison operations. The gain stage 41 generates the second residual analog signal $V_{OPC}$. The second residual analog signal $V_{OPC}$ is used in the next cycle according to the generated second digital value D2.

The logic circuit 43 generates a control signal $V_{CONT\_C}$ on the basis of the second digital value D2. The control signal $V_{CONT\_C}$ includes, for example, $\phi_{DH\_C}$, $\phi_{DL\_C}$, and $\phi_{DS\_C}$. The logic circuit 43 is connected to the outputs of the comparators 42a and 42b. Further, the logic circuit 43 is connected to the D/A conversion circuit 44. The logic circuit 43 provides the control signal $V_{CONT\_C}$ to the D/A conversion circuit 44. The logic circuit 43 receives the second digital value D2 including 2 bits (B0, B1) from the sub A/D conversion circuit 42. The logic circuit 43 generates the control signal $V_{CONT\_C}$ on the basis of the second digital value D2. If necessary, the sub A/D conversion circuit 42 compares the second residual analog signal $V_{OPC}$ with a reference signal using, for example, one comparator in time division. The sub A/D conversion circuit 42 provides the signals B1 and B0 indicating a comparison result.

The D/A conversion circuit 44 provides at least one of the first criterion reference voltage $V_{RH}$ and the second criterion reference voltage $V_{RL}$ to the gain stage 41. Specifically, the D/A conversion circuit 44 provides the at least one of the first criterion reference voltage $V_{RH}$ and the second criterion reference voltage $V_{RL}$ to the capacitor 48. The D/A conversion circuit 44 provides the at least one of the first criterion reference voltage $V_{RH}$ and the second criterion reference voltage $V_{RL}$ to the capacitor 49. Selection of the first criterion reference voltage $V_{RH}$ and the second criterion reference voltage $V_{RL}$ to be provided is based on the control signal $V_{CONT\_C}$. The D/A conversion circuit 44 is connected to the criterion voltage sources 35 and 36. The criterion voltage source 35 provides the first criterion reference voltage $V_{RH}$. The criterion voltage source 36 provides the second criterion reference voltage $V_{RL}$.

An output 44a of the D/A conversion circuit 44 provides an output voltage $V_{DA2}a$. An output 44b of the D/A conversion circuit 44 provides an output voltage $V_{DA2b}$. The D/A conversion circuit 44 operates as follows in response to the control signal $V_{CONT\_C}$. The control signal $V_{CONT\_C}$ is based on the second digital value D2 provided from the sub A/D conversion circuit 42.

$V_{DA2a}$, $V_{DA2b}=V_{RH}$ when a condition (D=2) is satisfied.
$V_{DA2a}=V_{RH}$ and $V_{DA2b}=V_{RL}$ when a condition (D=1) is satisfied
$V_{DA2a}$, $V_{DA2b}=V_{RL}$ when a condition (D=0) is satisfied.

In the second A/D conversion unit 7, the first voltage signal of the D/A conversion circuit 44 is provided to the capacitor 48. Further, in the second A/D conversion unit 7, the second voltage signal of the D/A conversion circuit 44 is provided to the capacitor 49. As a result, the two voltage signals are combined via the capacitors 48 and 49.

The D/A conversion circuit 44 includes outputs 44a and 44b and a switch circuit 57. The output 44a can be connected to one terminal of the capacitor 48. The output 44b can be connected to one terminal of the capacitor 49. The switch circuit 57 includes switches 57a, 57b and 57c. When the condition (D=2) is satisfied, the switches 57a and 57c are turned on, and the switch 57b is turned off in the switch circuit 57. According to this connection configuration, the switch circuit 57 provides the first criterion reference voltage $V_{RH}$ to the outputs 44a and 44b. When the condition (D=1) is satisfied, the switches 57a and 57b are turned on, and the switch 57c is turned off in the switch circuit 57. According to this connection configuration, the switch circuit 57 provides the first criterion reference voltage $V_{RH}$ to the output 44a. The switch circuit 57 also provides the second criterion reference voltage $V_{RL}$ to the output 44b. When the condition (D=0) is satisfied, the switches 57b and 57c are turned on, and the switch 57a is turned off in the switch circuit 57. According to this connection configuration, the switch circuit 57 provides the second criterion reference voltage $V_{RL}$ to the outputs 44a and 44b.

The operation of switch circuit 57 follows the control signal $V_{CONT\_C}$. Specifically, an opening and closing operation of the switch 57a follows the control signal $\phi_{DH\_C}$ provided from the logic circuit 43. An opening and closing operation of the switch 57b follows the control signal $\phi_{DL\_C}$ provided from the logic circuit 43. The opening and closing operation of the switch 57c follows the control signal $\phi_{DS\_C}$ provided from the logic circuit 43. Accordingly, the second digital value D2 determines the control signals $\phi_{DH\_C}$, $\phi_{DL\_C}$, and $\phi_{DS\_C}$ to be operated.

Next, the second A/D conversion operation that is performed by the second A/D conversion unit 7 will be described. The second A/D conversion operation is a cyclic A/D conversion operation. In this cyclic A/D conversion operation, the second digital value D2 is obtained from the first residual analog signal $V_{OPF}$ or the second residual analog signal $V_{OPC}$, which is an analog value. In the second A/D conversion operation, the second A/D conversion unit 7 first performs a necessary number of cyclic operations. Thereafter, the second A/D conversion unit 7 provides the second residual analog signal $V_{OPC}$ to the rear stage A/D conversion unit 4. In this computation operation, the gain stage 41 generates the second residual analog signal $V_{OPC}$ through the operation of the operational amplifier 47 and the capacitors 48, 49, and 50.

FIGS. 7(a), 7(b), and 7(c) are circuit diagrams illustrating the second A/D conversion operation. When the second A/D conversion operation is performed, the sub A/D conversion circuit 42 generates the second digital value D2 using the two comparators 42a and 42b, as described above.

The gain stage 41 performs a second storage operation as a second initial storage step (see FIG. 7(a)). In this step, the first residual analog signal $V_{OPF}$ received via the input 41a of the gain stage 41 is stored in the capacitors 48, 49, and 50. Specifically, in the gain stage 41, the capacitors 48, 49, and 50 are connected to the input 41a, and the capacitors 48, 49, and 50 are also connected to the inverting input of the operational amplifier 47. In the gain stage 41, the output of the operational amplifier 47 is connected to the inverting input. In the gain stage 41, the output of operational amplifier 47 is separated from the capacitor 50. In the gain stage 41, the output of the operational amplifier 47 is connected to the inverting input. In the gain stage 41, the non-inverting input of the operational amplifier 47 is connected to the criterion potential line $L_{COM}$.

The circuit configuration is realized by the control signals ($\phi_{DH\_C}=0$, $\phi_{DL\_C}=0$, and $\phi_{DS\_C}=0$) and control signals ($\phi_{3b}=1$, $\phi_{Sb}=1$, $\phi_{DSb}=1$, $\phi_{DHb}=0$, $\phi_{DLb}=0$, $\phi_{1b}=0$, $\phi_{2b}=1$, $\phi_{Rb}=1$, and $\phi_{4b}=0$). According to these control signals, the switches 57a, 57b and 57c of the D/A conversion circuit 44 are turned off. The switches 45, 51, 52a, 53, and 55 of the gain stage 41 are turned on. The switches 52b, 52c, 54, and 56 of the gain stage 41 are turned off.

In the gain stage 41, the criterion potential $V_{COM}$ is generated at the output of operational amplifier 47 when the inverting input and the output of operational amplifier 47 are conducted. In this connection, the sub A/D conversion circuit 42 receives the original first residual analog signal $V_{OPF}$. The sub A/D conversion circuit 42 generates the second digital value D2. The second digital value D2 is provided to the logic circuit 43. The logic circuit 43 generates the control signal $V_{CONT\_C}$ for controlling the D/A conversion circuit 44.

Subsequent to the second initial storage step, the second A/D conversion unit 7 performs a second computation operation as a second computation step (see FIG. 7(b)). In this step, in the gain stage 41, the second residual analog signal $V_{OPC}$ is generated at the output of the operational amplifier 47. The gain stage 41 generates a D/A conversion value according to the second digital value D2. In the gain stage 41, the D/A conversion value is provided to one terminal of the capacitors 48 and 49. Specifically, in the gain stage 41, the capacitor 48 is connected to the output 44a of the D/A conversion circuit 44, and the capacitor 48 is also connected to the inverting input of the operational amplifier 47. In the gain stage 41, the capacitor 49 is connected to the output 44b of the D/A conversion circuit 44, and the capacitor 49 is also connected to the inverting input of the operational amplifier 47. In the gain stage 41, the capacitor 50 is connected to the output of the operational amplifier 47, and the capacitor 50 is also connected to the inverting input of the operational amplifier 47. In the gain stage 41, one terminal of capacitors 48 and 49 is separated from the criterion potential line $L_{COM}$ by the switch 54. In the gain stage 41, the other terminal of the capacitors 48 and 49 is separated from the output of the operational amplifier 47 by the switch 45.

The circuit configuration is realized by the control signals ($\phi_{3b}$=0, $\phi_{Sb}$=0, $\phi_{DSb}$=0, $\phi_{DHb}$=1, $\phi_{DLb}$=1, $\phi_{1b}$=0, $\phi_{2b}$=1, $\phi_{Rb}$=0, and $\phi_{4b}$=1). According to these control signals, the switches 45, 51, 52a, 54, and 55 of the gain stage 41 are turned off. The switches 52b, 52c, 53, and 56 of the gain stage 41 are turned on.

Subsequent to the second computation operation step, the second A/D conversion unit 7 performs a second storage operation as a second storage step (see FIG. 7(c)). In this step, in the gain stage 41, the second residual analog signal $V_{OPC}$ of the operational amplifier 47 is stored in the capacitors 48 and 49. The gain stage 41 provides the second residual analog signal $V_{OPC}$ as an analog signal to the sub A/D conversion circuit 42. Specifically, in the gain stage 41, the capacitors 48 and 49 are connected in parallel to each other. In the gain stage 41, the capacitors 48 and 49 are connected to the output of the operational amplifier 47. In the gain stage 41, the capacitors 48 and 49 are separated from the input 41a by the switch 51. In the gain stage 41, the capacitors 48 and 49 are separated from the inverting input of the operational amplifier 47 by the switch 53. In the gain stage 41, the capacitors 48 and 49 are connected to the criterion potential line $L_{COM}$.

The circuit configuration is realized by the control signals ($\phi_{3b}$1, $\phi_{Sb}$=0, $\phi_{DSb}$=1, $\phi_{DHb}$=0, $\phi_{DLb}$=0, $\phi_{1b}$=1, $\phi_{2b}$=0, $\phi_{Rb}$=0, $\phi_{4b}$=1). According to this control signal, the switches 45, 52a, 54, and 56 of the gain stage 41 are turned on. The switches 51, 52b, 52c, 53, and 55 of the gain stage 41 are turned off.

After the initial storage operation and the computation operation are performed, the storage operation and the computation operation are repeated. According to this repetition, a sequence of second digital values D2 is generated. This repetition is performed until an A/D conversion result including a predetermined bit number Nb is obtained.

Figure 8:
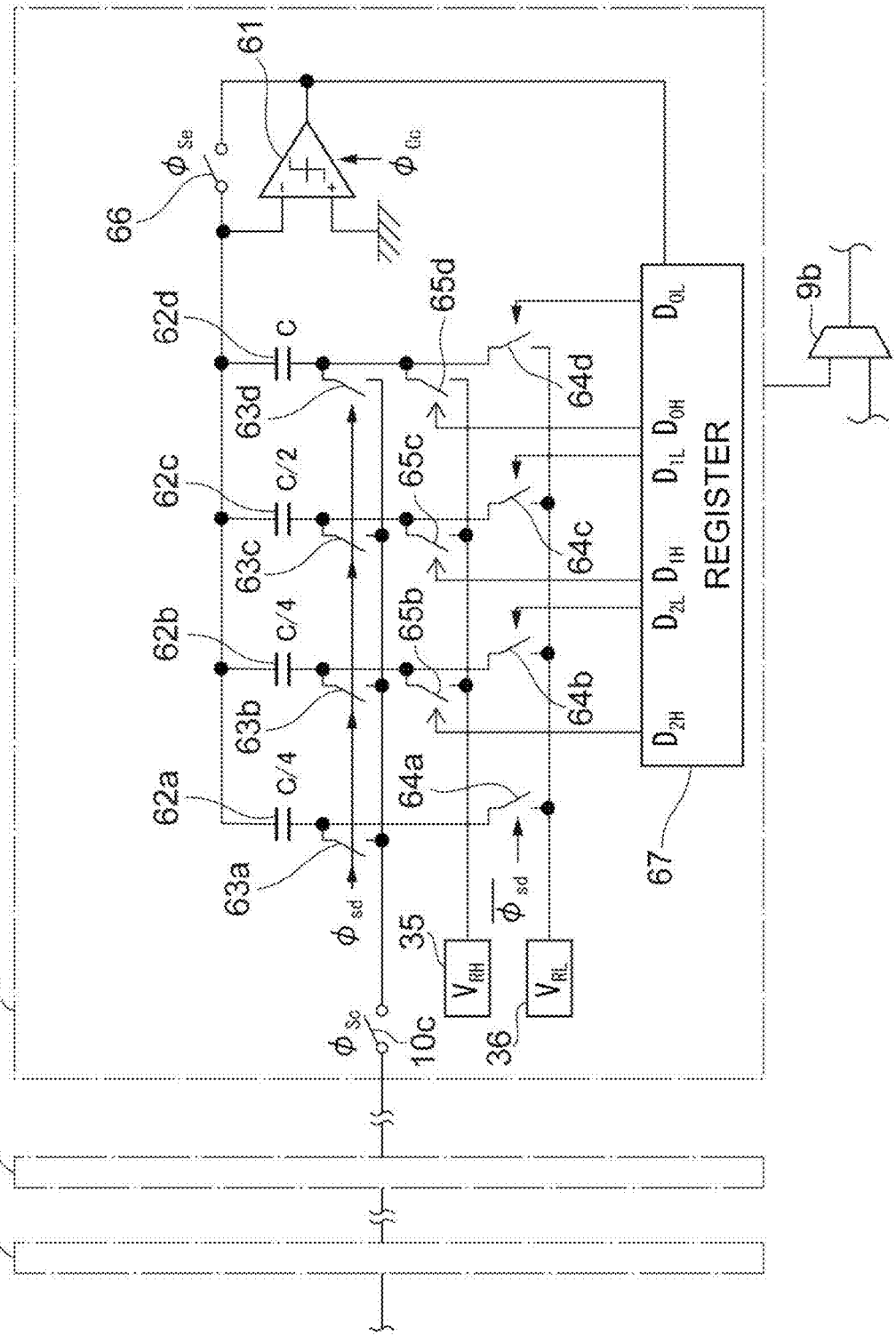
FIG. 8 is a circuit diagram of a rear stage A/D conversion unit to which a successive comparison A/D conversion circuit is applied.

FIG. 8 is a circuit diagram of the rear stage A/D conversion unit 4. The rear stage A/D conversion unit 4 performs a successive comparison A/D conversion operation. The successive comparison A/D conversion operation is an acyclic A/D conversion operation. The rear stage A/D conversion unit 4 includes a comparator 61, a plurality of capacitors 62a, 62b, 62c, and 62d, a plurality of switches 63a, 63b, 63c, 63d, 64a, 64b, 64c, 64d, 65b, 65c, and 65d, a switch 66, and a register 67. The comparator 61 compares the input second residual analog signal $V_{OPC}$ with a reference voltage.

The plurality of capacitors 62a, 62b, 62c, and 62d are connected to an input of the comparator 61. The switch 63a is connected to the capacitor 62a. The switch 63b is connected to the capacitor 62b. The switch 63c is connected to the capacitor 62c. The switch 63d is connected to the capacitor 62d. The switch 64a is connected to the capacitor 62a. The switch 64b is connected to the capacitor 62b. The switch 64c is connected to the capacitor 62c. The switch 65d is connected to the capacitor 62d. The switch 65b is connected to the capacitor 62b. The switch 65c is connected to the capacitor 62c. The switch 65d is connected to the capacitor 62d. The switch 66 is connected to the input of the comparator 61 and to an output of the comparator 61. The register 67 controls an opening and closing operation of the switches 64b, 64c, 64d, 65b, 65c, and 65d. Further, the register 67 stores an A/D conversion result. Here, a configuration capable of 3-bit A/D conversion process will be described. However, the rear stage A/D conversion unit 4 can realize an A/D conversion operation of arbitrary bits with the same configuration.

In the rear stage A/D conversion unit 4, the switches 63a, 63b, 63c, 63d, and 66 are turned on by the clock signals ($\phi_{Se}$=1 and $\phi_{Sd}$=1). As a result, an inverting input of the comparator 61 is connected to the output of the comparator 61. Further, the second residual analog signal $V_{OPC}$ is sampled by the capacitors 62a, 62b, 62c and 62d. In this case, the inverting input of the comparator 61 is set to a virtual ground potential. Then, the switches 63a, 63b, 63c, 63d, and 66 are turned off by the clock signals ($\phi_{Se}$=0 and $\phi_{Sd}$=0). As a result, a 3-bit code is set in the register 67. The code operates the capacitors 62a, 62b, 62c, and 62d as a capacitor array D/A conversion unit. Specifically, the 3-bit code is (D0, D1, D2). Here, D0 is the MSB, and D0, D1, and D2 are binary values of "0" or "1". When D2="1", a control signal D2H is set to "1", and the control signal D2L is set to "0". When D2="0", the control signal D2H is set to "0" is set, and the control signal D2L is set to "1". The set control signals D2H and D2L are output from the register 67. It should be noted that, when the second residual analog signal $V_{OPC}$ is sampled according to the clock signal ($\phi_{Sd}$=1), the control signal D2H is set to "0", and the control signal D2L is set to "0".

When the second residual analog signal $V_{OPC}$ is sampled by the capacitors 62a, 62b, 62c, and 62d, a net charge $Q_{NET}$ at the inverting input of the comparator 61 does not change. Further, when the capacitors 62a, 62b, 62c, and 62d are connected to a reference power supply under the control of the register 67, the net charge $Q_{NET}$ at the inverting input of the comparator 61 does not change. According to a charge conservation law, a relationship between a voltage of the inverting input of the comparator 61, a voltage of the second residual analog signal $V_{OPC}$, and a voltage of the reference power supply can be obtained by the following equation.

[Math. 3]

$$Q_{NET}=2C(0-V_{OPC})=C/4(V_S-V_{RL})+C/4(V_S-D_2\Delta V_R-V_{RL})+C/2(V_S-D_1\Delta V_R-V_{RL})+C(V_S-D_0\Delta V_R-V_{RL}) \quad (3)$$

Here, $\Delta V_R=V_{RH}-V_{RL}$. $V_{RL}$ is a voltage value that is input to the capacitors 62a, 62b, 62c, and 62d via the switches 64a, 64b, 64c, and 64d. The $V_{RH}$ is a voltage value that is input to the capacitors 62b, 62c, and 62d via the switches 65b, 65c, and 64d. By arranging these, the following equation is obtained.

[Math. 4]

$$V_S=V_{RL}+(2^{-1}D_0+2^{-2}D_1+2^{-3}D_2)\Delta V_R-V_{OPC} \quad (4)$$

That is, $V_s$ is given on the basis of a difference between the second residual analog signal $V_{OPC}$ and the output of the capacitor array D/A conversion unit.

The register 67 of the rear stage A/D conversion unit 4 is set such that resolution is improved by one bit as an operation proceeds. For example, when the first step is performed, the register 67 sets the 3-bit code as (D0, D1, D2)=(1, 0, 0). In this case, the comparator 61 compares the second residual analog signal $V_{OPC}$ with $V_{RL}+0.5\Delta V_R=0.5(V_{RH}+V_{RL})$. That is, the comparator 61 sets an A/D conversion range to a range from the first criterion reference voltage $V_{RH}$ to the second criterion reference voltage $V_{RL}$. The comparator 61 compares a median value of the range with the second residual analog signal $V_{OPC}$. When the second residual analog signal $V_{OPC}$ is greater than $0.5(V_{RL}+V_{RH})$, the register 67 establishes D0="1". When the second residual analog signal $V_{OPC}$ is smaller than $0.5(V_{RL}+V_{RH})$, the register 67 establishes D0="0". Then, when the register 67 establishes D0="1", (D0, D1, D2)=(1, 1, 0) is set in a second step. Accordingly, a second bit is established by comparing the second residual analog signal $V_{OPC}$ with $V_{RL}+0.75\Delta V_R=0.75V_{RH}+0.25V_{RL}$. By repeating such an operation up to a third step, the rear stage A/D conversion unit 4 performs a successive comparison A/D conversion operation with a resolution of 3 bits.

Figure 9:
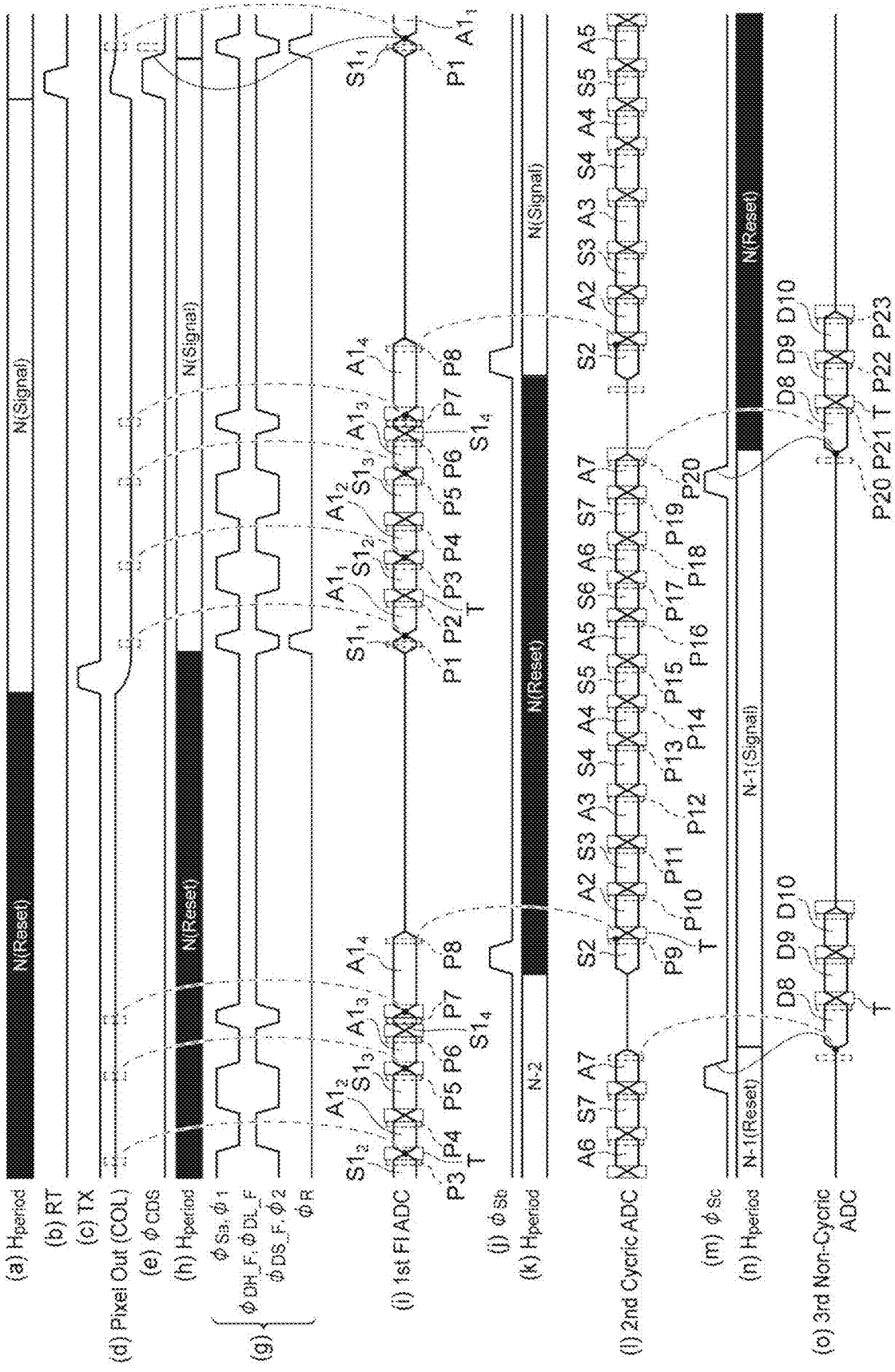
FIG. 9 is a diagram illustrating an operation timing of the A/D converter.

Next, the timing control unit 5 will be described. The timing control unit 5 controls an operation of the A/D converter 1 described above. FIG. 9 is a timing chart illustrating an operation timing of the A/D converter 1. FIG. 9(a) illustrates a horizontal period of a signal that is a processing target for pixel signal transfer. FIG. 9(b) illustrates a timing of the control signal $R_i$. FIG. 9(c) illustrates a timing of the control signal $TX_i$. FIG. 9(d) illustrates a timing of charge output from a pixel. FIG. 9(e) illustrates a timing of correlated double sampling using a control signal $\phi_{CDS}$ (see FIG. 2). FIG. 9(g) illustrates a timing of a control signal $\phi_{Sa}$ (see FIG. 4), and the like. FIG. 9(h) illustrates a horizontal period of a signal that is a processing target of the first A/D conversion unit 6. FIG. 9(i) illustrates timings of a storage operation and a computation operation in the first A/D conversion unit 6. FIG. 9(j) illustrates a timing of a control signal $\phi_{Sb}$ (see FIG. 6). FIG. 9(k) illustrates a horizontal period of a signal that is a processing target of the second A/D conversion unit 7. FIG. 9(l) illustrates timings of a storage operation and a computation operation in the second A/D conversion unit 7. FIG. 9(m) illustrates a timing of a control signal $\phi_{Sc}$ (see FIG. 8). FIG. 9(n) illustrates a horizontal period of a signal that is a processing target of the rear stage A/D conversion unit 4. FIG. 9(o) illustrates a timing of successive comparison in the rear stage A/D conversion unit 4.

The first A/D conversion unit 6, the second A/D conversion unit 7, and the rear stage A/D conversion unit 4 include a function of sampling/holding the signal that is a processing target. Therefore, the first A/D conversion unit 6, the second A/D conversion unit 7, and the rear stage A/D conversion unit 4 can execute pipeline processing that is in parallel with each other. That is, when the A/D conversion process regarding an Nth horizontal period is completed, the first A/D conversion unit 6 starts the A/D conversion process regarding an (N+1)th horizontal period immediately after the second A/D conversion unit 7 is caused to hold the first residual analog signal $V_{OPF}$ by the control signal $\phi_{Sb}$. Similarly, when the A/D conversion process regarding an Nth horizontal period is completed, the second A/D conversion unit 7 starts an A/D conversion process regarding the (N+1)th horizontal period immediately after the second residual analog signal $V_{OPC}$ is held in the rear stage A/D conversion unit 4 by the control signal $\phi_{Sc}$.

Thus, the pipeline processing is performed. Therefore, the timing control unit 5 performs timing control to secure accuracy of A/D conversion. According to the timing control, a timing of each control signal is excluded from a predetermined timing. Specifically, the timing control unit 5 excludes a timing at which switching between the first storage operation and the first computation operation regarding the folding integration A/D conversion operation is performed (a transition period), from the end period of the second storage operation regarding the cyclic A/D conversion operation. Further, the timing control unit 5 excludes the timing (transition period) from an end period of the second computation operation regarding the cyclic A/D conversion operation. Further, the timing control unit 5 excludes a timing of the comparison operation in the rear stage A/D conversion unit 4 from the end period of the first storage operation regarding the folding integration A/D conversion operation. Further, the timing control unit 5 excludes the timing of the comparison operation in the rear stage A/D conversion unit 4 from the end period of the first computation operation. Furthermore, the timing control unit 5 excludes the timing of the comparison operation in the rear stage A/D conversion unit 4 from the end period of the second storage operation regarding the cyclic A/D conversion operation. Further, the timing control unit 5 excludes the timing of the comparison operation in the rear stage A/D conversion unit 4 from the end period of the second computation operation. Further, the timing control unit 5 excludes a transition period of the A/D conversion circuit on the rear stage side from an end period of the storage operation period and an end period of the computation operation period of the A/D conversion circuit on the front stage side. Control for excluding the transition period from the end period of the storage operation period and the end period of the computation operation period is important from the viewpoint of accuracy improvement.

Such timing control will be described with reference to FIG. 9. FIG. 9(i) illustrates timings of a storage operation period and a computation operation period for each number of integrations. These timings relate to a digital value of a first bit resulting from the folding integration A/D conversion process of the first A/D conversion unit. For example, a storage operation period and a computation operation period of an m-th (m=1, 2, 3, 4) integration are "S1m" and "A1m". FIG. 9(l) illustrates timings of the storage operation period and the computation operation period regarding each digital value resulting from the cyclic A/D conversion process of the second A/D conversion unit, for each bit. For example, a storage operation period of an m-th bit (m=2, 3, 4, 5, 6, 7) is "Sm", and a computation operation period thereof is "Am". FIG. 9(o) illustrates timings of successive comparison of a digital value of the m-th bit in the acyclic A/D conversion process of the rear stage A/D conversion unit using "Dm" (m=8, 9, 10). Solid squares (symbol T) in FIG. 9 indicate transition timings of the storage operation period and the computation operation period in the folding integration A/D conversion operation and the cyclic A/D conversion operation, and a transition timing of a bit code in the acyclic A/D conversion operation. In FIG. 9, dotted boxes (P1, P2, P3, P4, P5, P6, P7, P8, P9, P10, P11, P12, P13, P14, P15, P16, P17, P18, P18, P19, P20, P21, P22, P22, and P23: hereinafter, "P1 to P23") indicate timings (control target timings) desired to be excluded not to temporally overlap with such transition timings. Examples of the control target timings P1 to P23 include:

P1: End of initial storage operation for first integration

P2: first integration and S/H of residual potential (end of a computation operation)

P3: End of a storage operation for second integration

P4: Second integration and S/H of residual potential (end of a computation operation)

P5: End of a storage operation for third integration

P6: Third integration and S/H of a residual potential (end of a computation operation)

P7: End of a storage operation for fourth integration

P8: Fourth integration and S/H of a residual potential (end of a computation operation)

P9: AD conversion of a first cycle (a second bit) (end of an initial storage operation of the first cycle)

P10: S/H of a residual amplification potential of the first cycle (the second bit) (end of a computation operation of the first cycle)

P11: AD conversion of a second cycle (a third bit) (end of a storage operation of the second cycle)

P12: S/H of a residual amplification potential of the second cycle (the third bit) (end of a computation operation of the second cycle)

P13: AD conversion of a third cycle (a fourth bit) (end of a storage operation of the third cycle)

P14: S/H of a residual amplification potential of the third cycle (the fourth bit) (end of a computation operation of the third cycle)

P15: AD conversion of a fourth cycle (a fifth bit) (end of a storage operation of the fourth cycle)

P16: S/H of a residual amplification potential of the fourth cycle (the fifth bit) (end of a computation operation of the fourth cycle)

P17: AD conversion of a fifth cycle (a sixth bit) (end of a storage operation of the fifth cycle)

P18: S/H of a residual amplification potential of the fifth cycle (the sixth bit) (end of a computation operation of the fifth cycle)

P19: AD conversion of a sixth cycle (a seventh bit) (end of a storage operation of the sixth cycle)

P20: S/H of a residual amplification potential of the sixth cycle (the seventh bit) (end of a computation operation of the sixth cycle)

P21: A/D conversion of an eighth bit (end of successive comparison of the eighth bit)

P22: AD conversion of a ninth bit (end of successive comparison of the ninth bit)

P23: AD conversion of a tenth bit (a least significant bit) (end of successive comparison of the tenth bit)

The timing control unit 5 generates a control signal so that a transition timing in the A/D conversion is excluded from the control target timings P1 to P23. In particular, in the folding integration A/D conversion circuit and the cyclic A/D conversion circuit on the front stage side, it is highly effective to exclude the control object timings of P1 to P20 from the transition timing in terms of improvement of the accuracy. An input signal level on the front side is lower than that on the rear side. Therefore, it is possible to effectively improve conversion accuracy by preventing noise from being mixed.

According to the A/D converter 1 of the embodiment, the first A/D conversion unit 6, to which an analog value is input, generates the first digital value D1 and the first residual analog signal $V_{OPF}$. Then, the second A/D conversion unit 7, to which the first residual analog signal $V_{OPF}$ is input, further generates the second digital value D2 and the second residual analog signal $V_{OPC}$. The rear stage A/D conversion unit 4 to which the second residual analog signal $V_{OPC}$ is input generates the third digital value D3. According to such a configuration, in the A/D converter that obtains digital values through a plurality of A/D conversion operations, the folding integration A/D conversion operation is first performed. In the folding integration A/D conversion operation, the integration operation is performed N times such that a signal component of the image sensor is N-folded. On the other hand, in the folding integration A/D conversion operation, a random noise component is $\sqrt{N}$-folded (a square root of N). Therefore, the S/N ratio in the image sensor signal is improved by $\sqrt{N}$ times. Therefore, the random noise can be reduced. Further, accuracy required for the second A/D conversion unit 7 on the rear stage side in the front stage A/D conversion unit 3 can be lowered as compared with the first A/D conversion unit 6 on the front stage side. Therefore, total power consumption of the front stage A/D conversion unit 3 can be reduced. Further, the rear stage A/D conversion unit 4 performs an A/D conversion operation using an acyclic A/D conversion operation. Therefore, the rear stage A/D conversion unit 4 can further reduce power consumption. In addition, in the front stage A/D conversion unit 3, accuracy required for an A/D conversion circuit of the second A/D conversion unit 7 on the rear stage side can be lower as compared with that of the first A/D conversion unit 6 on the front stage side. Therefore, high speed of the A/D conversion operation can also be realized. As a result, it is possible to provide the A/D converter 1 capable of realizing high speed and noise reduction while suppressing power consumption.

The A/D converter 1 of the embodiment can improve the S/N ratio, for example, as compared with a configuration in which a plurality of stages of cyclic A/D conversion units and acyclic A/D conversion units are combined. Therefore, the A/D converter 1 of the embodiment can be used, for example, as an image sensor with ultra-high sensitivity.

The A/D converter 1 of the embodiment can improve a frame rate, as compared with a configuration in which one circuit is switched between a folding integration A/D conversion unit and a cyclic A/D conversion unit.

According to the A/D converter 1 of the embodiment, the first A/D conversion unit 6 and the second A/D conversion unit 7 are physically separate circuits. Therefore, the pipeline processing can be applied when the folding integration A/D conversion operation in the first A/D conversion unit 6 and the cyclic A/D conversion operation in the second A/D conversion unit 7 are executed. Therefore, it is possible to realize a high-speed A/D conversion operation. Further, according to the pipeline processing, it is possible to secure a longer time that can be assigned to the folding integration A/D conversion operation in the first A/D conversion unit 6. Therefore, it is possible to increase the number of repetitions of the integration operation. Therefore, it is possible to further enhance the S/N ratio.

In short, the A/D converter 1 of this embodiment can achieve a high frame rate due to a good S/N ratio and a high-speed A/D conversion operation. A dynamic range can be expanded by the folding integration A/D conversion operation. Further, in the A/D converter 1 of this embodiment, the circuit that performs the folding integration A/D conversion operation and the circuit that performs the cyclic A/D conversion operation are separate circuits. Therefore, the A/D converter 1 can have a circuit configuration suitable for the respective operations. In the A/D converter 1, it is possible to optimize the disposition and number of capacitors or switches. Therefore, in the A/D converter 1, it is possible to suppress generation of noise.

The present invention has been described above in detail on the basis of the embodiments. However, the present invention is not limited to the above embodiments. The present invention can be variously modified without departing from the gist of the invention.

Modification Example 1

The rear stage A/D conversion unit may have a circuit configuration different from that of the circuit illustrated in FIG. 8. For example, the rear stage A/D conversion unit may have a circuit configuration illustrated in FIG. 10.

Figure 10:
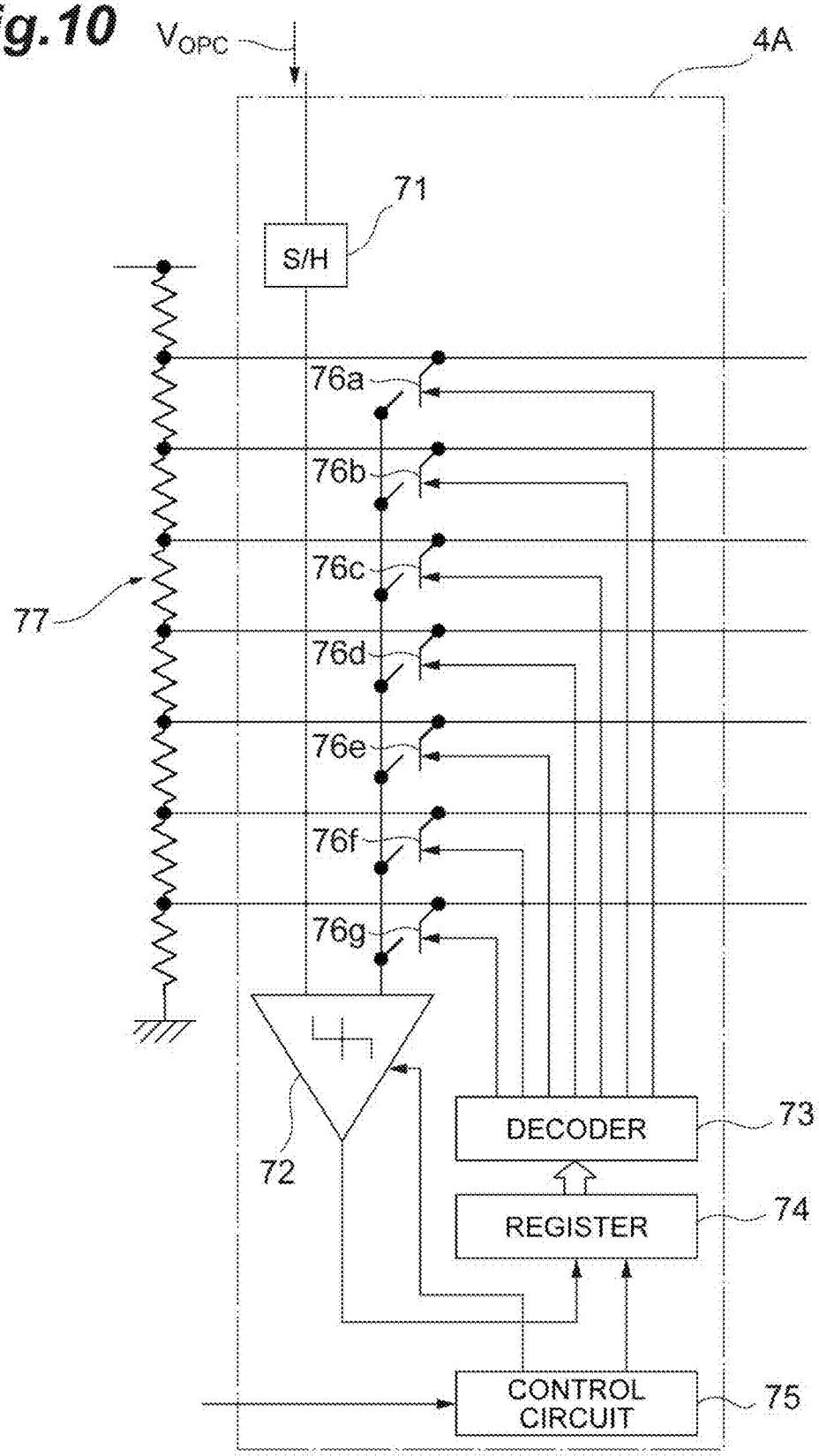
FIG. 10 is a circuit diagram of a rear stage A/D conversion unit according to a modification example.

FIG. 10 is a circuit diagram of the rear stage A/D conversion unit 4A. The rear stage A/D conversion unit 4A receives the second residual analog signal $V_{OPC}$ from the second A/D conversion unit 7. The A/D converter 1 generates the third digital value D3. The third digital value D3 indicates the second residual analog signal $V_{OPC}$. In detail, the rear stage A/D conversion unit 4A is an acyclic A/D conversion circuit. The rear stage A/D conversion unit 4A performs an A/D conversion operation on the basis of a comparison signal between a time-varying reference voltage (a reference value) and the second residual analog signal $V_{OPC}$. For example, the rear stage A/D conversion unit 4A is a successive comparison A/D conversion circuit. The successive comparison A/D conversion circuit performs an A/D conversion operation by comparing the criterion potential successively obtained by a switching means or the like with the second residual analog signal $V_{OPC}$.

FIG. 10 illustrates an example of a configuration of the rear stage A/D conversion unit 4A to which the successive comparison A/D conversion circuit is applied. The rear stage A/D conversion unit 4A includes a sample and hold circuit (an S/H circuit 71), a comparator 72, a decoder 73, and a plurality of switches 76a, 76b, 76c, 76d, 76e, 76f, and 76g, a register 74, and a control circuit 75. The sample and hold circuit (S/H circuit 71) samples and holds the input second residual analog signal $V_{OPC}$. The comparator 72 compares the second residual analog signal $V_{OPC}$ with the reference voltage. The decoder 73 selects a reference voltage to be input to the comparator 72. The plurality of switches 76a, 76b, 76c, 76d, 76e, 76f, and 76g are controlled by the decoder 73. The register 74 determines a digital value on the basis of the selection of the plurality of switches 76a, 76b, 76c, 76d, 76e, 76f, and 76g operated by the decoder 73 and a comparison signal of the comparator 72. Further, the register 74 stores the digital value. The control circuit 75 controls operations of the register 74 and the comparator 72. A plurality of reference voltages are input to the rear stage A/D conversion unit 4A. The plurality of reference voltages include a voltage having a stepwise magnitude that is output from a voltage division circuit 77 common to the array of the A/D converters 1. The voltage division circuit 77 is connected to one input of the comparator 72 through switches 76a, 76b, 76c, 76d, 76e, 76f, and 76g. According to this connection, one of the plurality of reference voltages is selectively input to one input of the comparator 72. The second residual analog signal $V_{OPC}$ is input to the other input of the comparator 72 through the S/H circuit 71.

The rear stage A/D conversion unit 4A realizes, for example, a 3-bit A/D conversion operation as follows. Although the 3-bit A/D conversion process has been described here, an any-bit A/D conversion operation can also be realized by the same operation. That is, the control circuit 75 controls the register 74 and the decoder 73. According to this control, a reference voltage having a medium value is selected from a reference voltage with seven steps. As a result, the register 74 determines the most significant bit value on the basis of the comparison signal obtained from the comparator 72. Further, the register 74 stores the most significant bit value. Then, the control circuit 75 controls the register 74 and the decoder 73 according to the comparison signal of the comparator 72. According to this control, a reference voltage having a medium value is selected from a reference voltage with three steps greater or smaller than the selected reference voltage. As a result, the register 74 determines a bit value at a medium level on the basis of the comparison signal obtained from the comparator 72. Further, the register 74 stores the bit value at the medium level. Similarly, the control circuit 75 controls the register 74 and the decoder 73 according to the comparison signal of comparator 72. According to this control, the reference voltage of one step greater or smaller than the selected reference voltage is selected. As a result, the register 74 determines the least significant bit value on the basis of the comparison signal obtained from the comparator 72. Further, the register 74 stores the least significant bit value. The digital value finally stored in the register 74 is output as the third digital value.

According to the rear stage A/D conversion unit 4A, a circuit area can be reduced. That is, the rear stage A/D conversion unit 4A does not include capacitors other than the S/H circuit. Therefore, the rear stage A/D conversion unit 4A can also reduce noise generation due to a combination of wirings and capacitors. As a result, in the rear stage A/D conversion unit 4A, restrictions on a circuit layout of an LSI and the like are reduced.

Modification Example 2

The rear stage A/D conversion unit may have a circuit configuration different from that of the circuits illustrated in FIGS. 8 and 10. For example, the rear stage A/D conversion unit may have a circuit configuration illustrated in FIG. 11.

Figure 11:
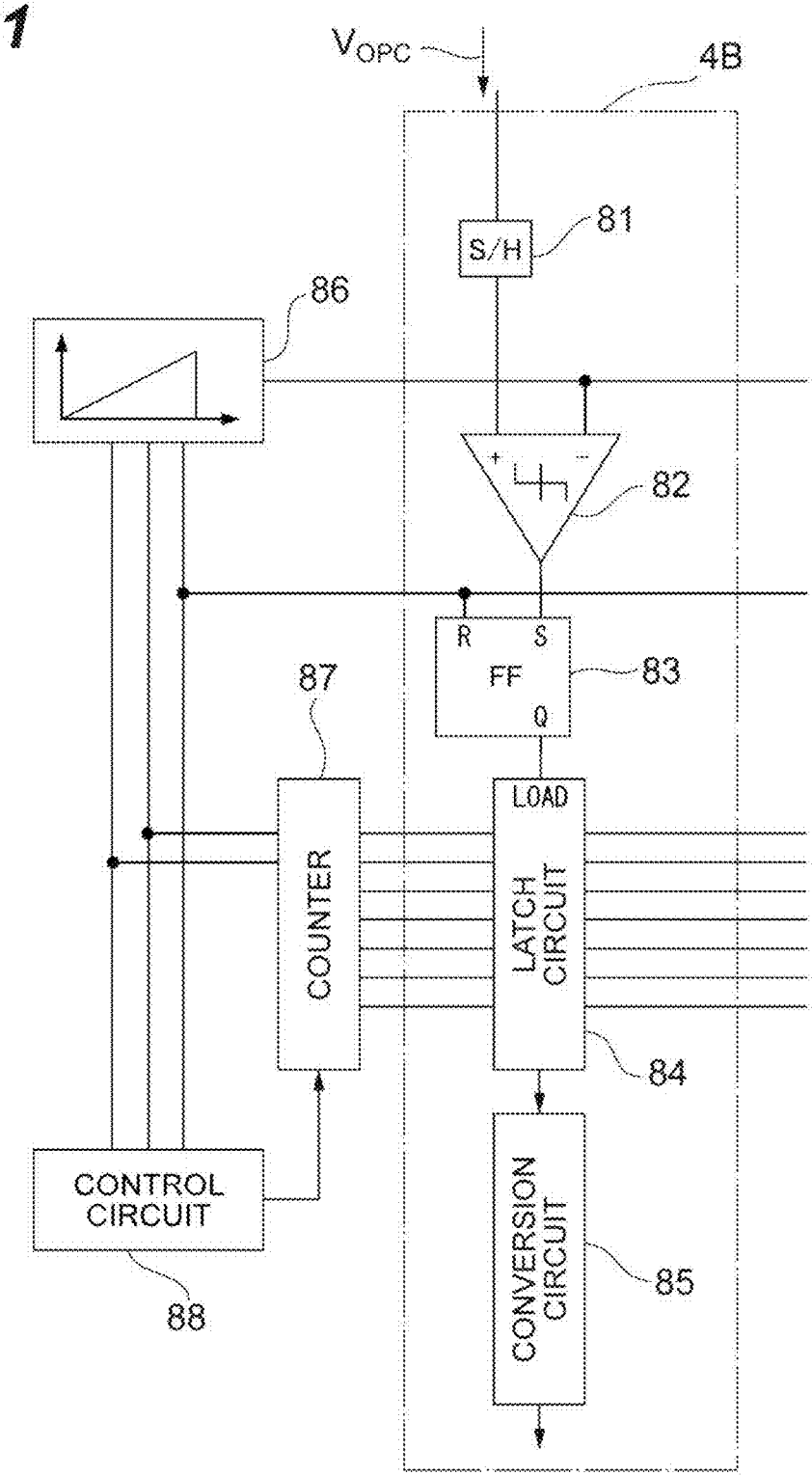
FIG. 11 is a circuit diagram of a rear stage A/D conversion unit according to another modification example.

The rear stage A/D conversion unit 4B illustrated in FIG. 11 is a single slope A/D conversion circuit. The rear stage A/D conversion unit 4B includes an S/H circuit 81, a comparator 82, a flip flop (FF) circuit 83, a latch circuit 84, and a conversion circuit 85. The S/H circuit 81 samples and holds the second residual analog signal $V_{OPC}$ from the second A/D conversion unit 7. The comparator 82 compares the second residual analog signal $V_{OPC}$ with a ramp signal which is a reference signal. The latch circuit 84 holds a timing at which an output of the comparator 82 changes. In the rear stage A/D conversion unit 4B, a ramp signal generation circuit 86, a gray code counter 87, and a control circuit 88 are common to the array. The latch circuit 84 receives a count value counted by the gray code counter 87 on the basis of a clock from the control circuit 88. The ramp signal generation circuit 86 generates the ramp signal on the basis of the control signal from the control circuit 88. One input of the comparator 82 receives the final second residual analog signal $V_{OPC}$ of the second A/D conversion unit 7. The other input of comparator 82 receives the ramp signal from the ramp signal generation circuit 86. The comparator 82 outputs a comparison signal obtained by comparing these signals. Further, the comparator 82 provides a comparison signal to a storage control input $L_{OAD}$ of the latch circuit 84 via the flip flop circuit 83. In response to the comparison signal, the latch circuit 84 latches a gray code count value at this time. The latched gray code count value is generated as an A/D conversion value (the third digital value D3) via the conversion circuit 85. Further, the gray code count value is output.

In the modification example in which the rear stage A/D conversion unit 4B is included, the timing control unit 5 generates a control signal so that the transition timing in A/D conversion is excluded from the control target timing. However, the timing control unit 5 performs control so that a timing (a clock timing by the control circuit 88) at which a gray code coefficient value is latched after comparison between the second residual analog signal $V_{OPC}$ and the reference signal in the rear stage A/D conversion unit 4B is excluded from the transition timing in the A/D conversion. In particular, the timing control unit 5 performs control so that the timing at which the gray code coefficient value is latched is excluded from the end period of the storage operation period and the end period of the computation operation period in the cyclic A/D conversion. The operation of the rear stage A/D conversion unit 4B generates noise. For example, this noise includes noise that is mixed into a hold node via a parasitic capacitor or the like. The noise affects the digital value and the residual value generated and output by the first A/D conversion unit 6 and the second A/D conversion unit 7. According to the control that is performed by the rear stage A/D conversion unit 4B, it is possible to prevent a decrease in accuracy of the digital value and the residual value. Further, in the rear stage A/D conversion unit 4B, a single slope A/D conversion circuit is used for a last stage. According to this configuration, when an A/D conversion operation of a small number of bits (1, 2, 3, or 4 bits) is performed, timings of a transition to be shifted from another A/D conversion should be at most about 16 times. Therefore, it is possible to increase a degree of freedom of timing of A/D conversion.

Modification Example 3

Figure 12:
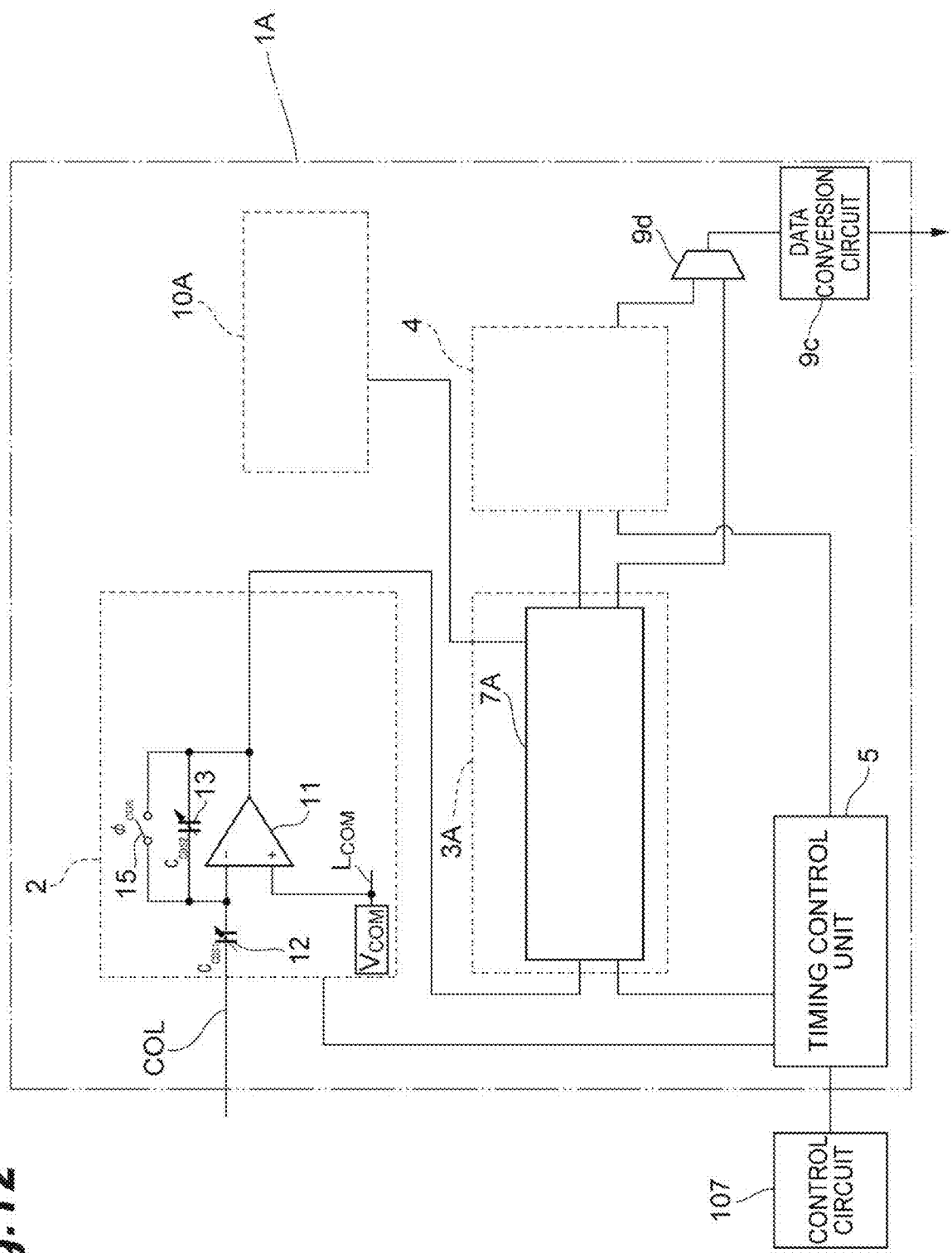
FIG. 12 is a diagram schematically illustrating a circuit block of an A/D converter according to a modification example.

In the embodiment, in the A/D converter 1, the circuit that performs the folding integration A/D conversion operation and the circuit that performs the cyclic A/D conversion operation are separate circuits. That is, the front stage A/D conversion unit 3 includes two circuits that perform A/D conversion operations in different aspects. For example, as illustrated in FIG. 12, the front stage A/D conversion unit 3A may include one third A/D conversion unit 7A (a third circuit). The third A/D conversion unit 7A can switch between a circuit that performs the folding integration A/D conversion operation and a circuit that performs the cyclic A/D conversion operation by controlling a plurality of switches.

An A/D converter 1A includes a CDS circuit 2, a front stage A/D conversion unit 3A, a rear stage A/D conversion unit 4, a timing control unit 5, and a reference voltage generation unit 10A. The CDS circuit 2, the rear stage A/D conversion unit 4, and the timing control unit 5 have the same configuration as that of the A/D converter 1 according to the above embodiment. Further, the CDS circuit 2, the rear stage A/D conversion unit 4, and the timing control unit 5 perform the same operation as that of the A/D converter 1 according to the above embodiment. Hereinafter, the reference voltage generation unit 10A and the third A/D conversion unit 7A of the front stage A/D conversion unit 3A will be described in detail.

The reference voltage generation unit 10A generates the first conversion reference voltage $V_{RCH}$ and the second conversion reference voltage $V_{RCL}$. The first conversion reference voltage $V_{RCH}$ and the second conversion reference voltage $V_{RCL}$ are provided to the sub A/D conversion circuit 42 of the third A/D conversion unit 7A. The reference voltage generation unit 10A provides the first conversion reference voltage $V_{RCH}$ to the comparator 42a. Further, the reference voltage generation unit 10A provides the second conversion reference voltage $V_{RCL}$ to the comparator 42b.

The reference voltage generation unit 10A generates the first conversion reference voltage $V_{RCH}$ on the basis of the first criterion reference voltage $V_{RH}$. Further, the reference voltage generation unit 10A generates the second conversion reference voltage $V_{RCL}$ on the basis of the second criterion reference voltage $V_{RL}$. It should be noted that the first criterion reference voltage $V_{RH}$ is provided from the criterion voltage source 35. Further, the second criterion reference voltage $V_{RL}$ is provided from the criterion voltage source 36. An example of a circuit diagram of the reference voltage generation unit 10A is illustrated in FIG. 13.

Figure 13:
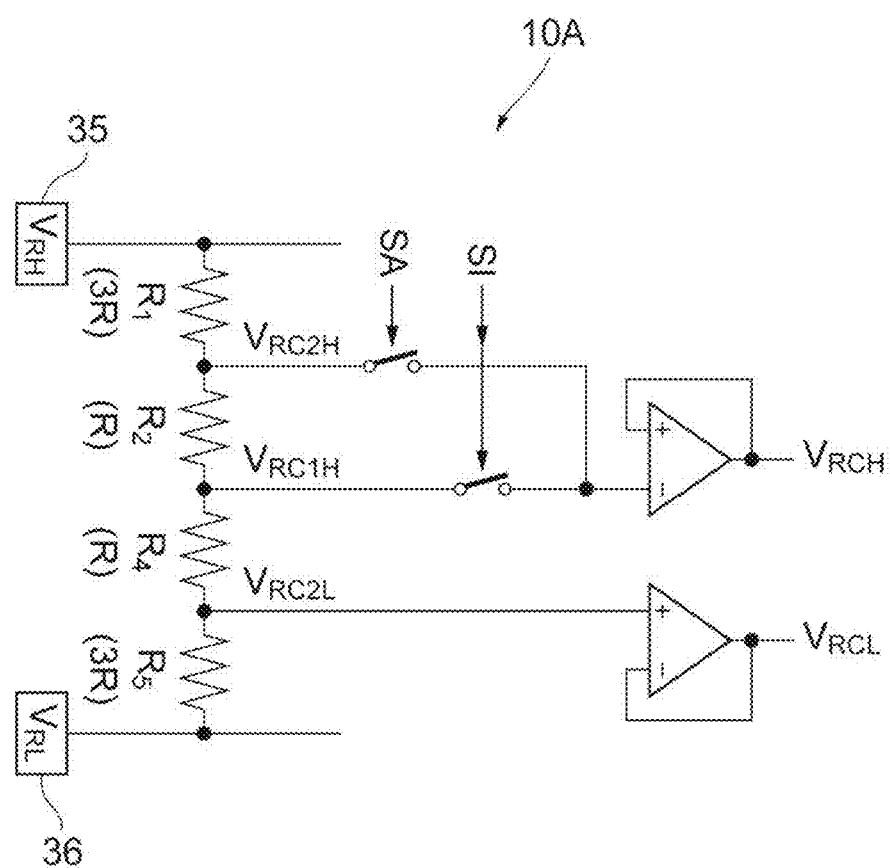
FIG. 13 is a circuit diagram of a reference voltage generation unit according to a modification example.

When the folding integration A/D conversion operation of the front stage A/D conversion unit 7A is performed, the reference voltage generation unit 10A of FIG. 13 provides the voltage $V_{RC1H}$ as the first conversion reference voltage $V_{RCH}$ on the basis of an operation of a switch SI. On the other hand, when the cyclic A/D conversion operation of the front stage A/D conversion unit 7A is performed, the reference voltage generation unit 10A provides the voltage $V_{RC2H}$ as the first conversion reference voltage $V_{RCH}$ on the basis of an operation of a switch SA. Further, the reference voltage generation unit 10A provides the voltage $V_{RC2L}$ as the second conversion reference voltage $V_{RCL}$ when the cyclic A/D conversion operation of the front stage A/D conversion unit 7A is performed.

The reference voltage generation unit 10A sets the first conversion reference voltage $V_{RCH}$ when the folding integration A/D conversion operation is performed, to the median value between the first criterion reference voltage $V_{RH}$ and the second criterion reference voltage $V_{RL}$. A voltage $V_{RC2H}$ expressed by the following equation is provided as the first conversion reference voltage $V_{RCH}$ when the cyclic A/D conversion operation is performed. Further, a voltage $V_{RC2L}$ expressed by the following equation is provided as the second conversion reference voltage $V_{RCH}$ when the cyclic A/D conversion operation is performed.

$$V_{RC2H}=(5V_{RH}+3V_{RL})/8$$

$$V_{RC2L}=(3V_{RH}+5V_{RL})/8$$

Figure 14:
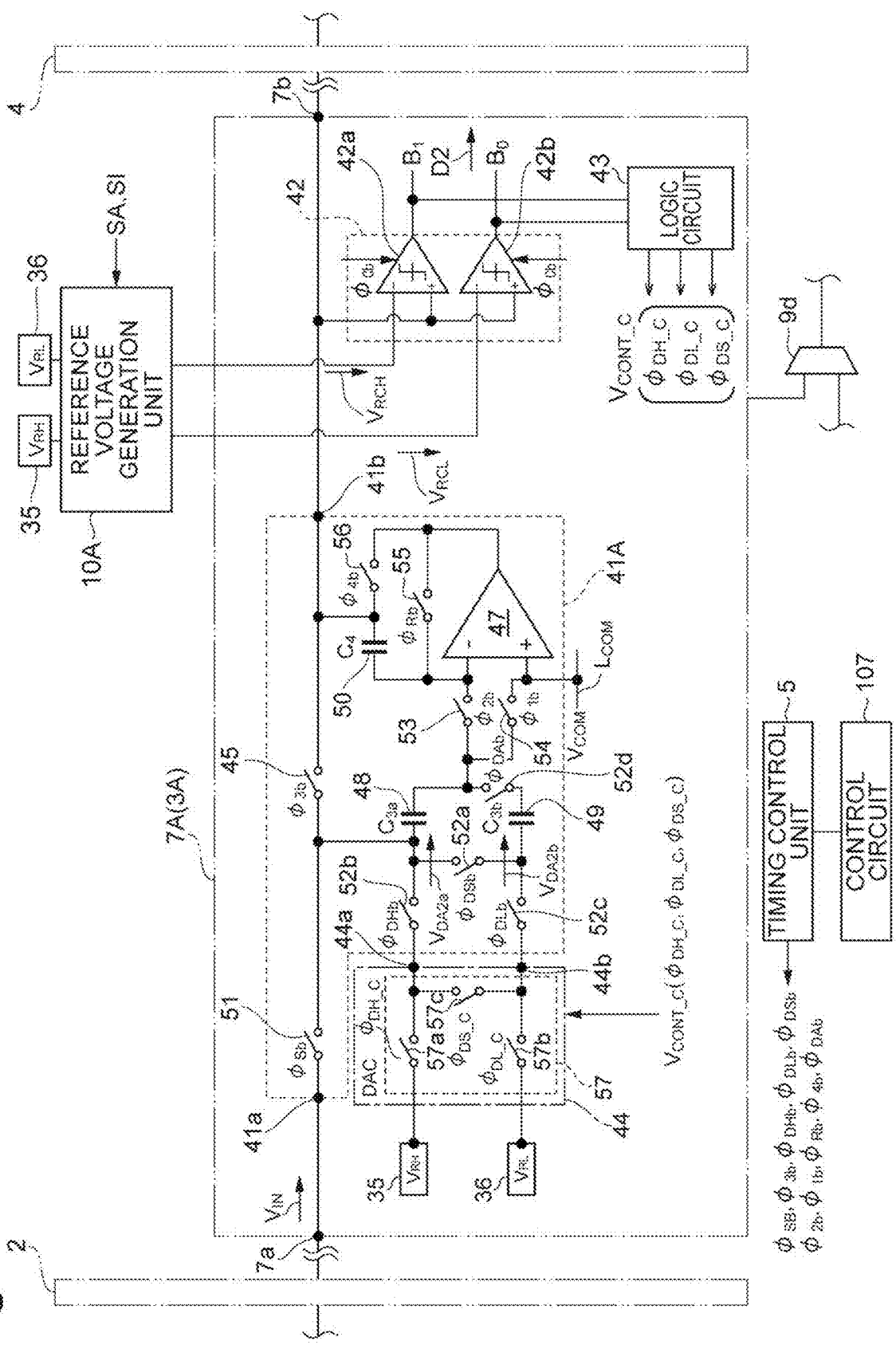
FIG. 14 is a circuit diagram of a third A/D conversion unit.

FIG. 14 is a circuit diagram of a third A/D conversion unit 7A. The third A/D conversion unit 7A has a configuration similar to that of the second A/D conversion unit 7 in the A/D converter 1. Specifically, the third A/D conversion unit 7A is different from the second A/D conversion unit 7 in that the third A/D conversion unit 7A includes a switch 52d. The switch 52d is connected to the capacitor 49 and connected to the switches 53 and 54. Other configurations are the same as those of the second A/D conversion unit 7.

The third A/D conversion unit 7A includes a common input, a common front stage capacitor, a common operational amplifier, a common output, and a common feedback capacitor. The common input receives an analog signal or a first residual analog signal. The common front stage capacitor can be connected to the common input. The common operational amplifier includes an inverting input that can be connected to the common front stage capacitance. The common output is connected to the output of the common operational amplifier. The common feedback capacitor can be connected between the inverting input and the output of the common operational amplifier.

In the third A/D conversion unit 7A illustrated in FIG. 14, the common input corresponds to the input 7a. The common front stage capacitor corresponds to at least one of the capacitors 48 and 49. The common operational amplifier corresponds to the operational amplifier 47. The common output corresponds to the output 7b. The common feedback capacitor corresponds to the capacitor 50. The common gain stage corresponds to a gain stage 41A. That is, the A/D converter 1A executes the folding integration A/D conversion operation and the cyclic A/D conversion operation in the gain stage 41A.

When the third A/D conversion unit 7A is caused to perform folding integration A/D conversion, various circuit configurations can be taken. For example, a circuit configuration in which the switches 52a and 52d are turned on and the capacitors 48 and 49 are used as common front stage capacitors may be adopted. Further, a circuit configuration in which the switches 52a and 52d are turned off, and only the capacitor 48 is used as the common front stage capacitor may be adopted. According to this circuit configuration, when the folding integration A/D conversion operation is performed, the capacitor 49 is separated from the circuit that performs the A/D conversion operation. Therefore, it is possible to suppress a decrease in S/N ratio when the folding integration A/D conversion operation is performed.

For example, a circuit configuration in which the capacitor 48 is used as the common front stage capacitor may be adopted. According to this circuit configuration, the folding integration A/D conversion operation has a first storage operation and a first computation operation. In the first storage operation, the capacitor 48 stores the input value $V_{IN}$. In the first computation operation, the gain stage 41A generates the first residual analog signal $V_{OPF}$. When the first storage operation is performed, the capacitor 48 is connected to the input 41a in the gain stage 41A. Further, in the gain stage 41A, the capacitor 50 is connected to the output of the operational amplifier 47 and the capacitor 50 is connected to the inverting input of the operational amplifier 47. When the first computation operation is performed, the capacitor 48 is connected to the operational amplifier 47 in the gain stage 41A. Further, in the gain stage 41A, the capacitor 50 is connected to the output of the operational amplifier 47, and the capacitor 50 is connected to the inverting input of the operational amplifier 47.

When the third A/D conversion unit 7A is caused to perform the cyclic A/D conversion operation, the switch 52d is turned on. Then, the circuit configuration of the third A/D conversion unit 7A is the same as the circuit configuration of the second A/D conversion unit 7 of the A/D converter 1. Therefore, the cyclic A/D conversion operation can be performed by the third A/D conversion unit 7A.

The cyclic A/D conversion operation includes a second storage operation and a second computation operation. In the second storage operation, the capacitors 48 and 49 store the first residual analog signal $V_{OPF}$ or the second residual analog signal $V_{OPC}$. In the second computation operation, the gain stage 41A generates the second residual analog signal $V_{OPC}$. In the second storage operation, in the gain stage 41, the capacitors 48 and 49 are connected to the input 41a or the output of the operational amplifier 47. Further, in the gain stage 41, the capacitor 50 is connected between the input 41a or the output of the operational amplifier 47 and the inverting input. In the second operation, in the gain stage 41, the capacitors 48 and 49 are connected to the operational amplifier 47. Further, in the gain stage 41, the capacitor 50 is connected between the output and the inverting input of the operational amplifier 47.

According to the A/D converter 1A, the first A/D conversion unit and the second A/D conversion unit are realized by a common circuit. The first A/D conversion unit performs the folding integration A/D conversion operation in the front stage A/D conversion unit 3A. The second A/D conversion unit performs the cyclic A/D conversion operation. Therefore, it is possible to reduce a circuit area occupied by the front stage A/D conversion unit 3A.

In the A/D converter 1A, the circuit that performs the folding A/D conversion operation and the circuit that performs the cyclic A/D conversion operation are common. Therefore, these A/D conversion operations cannot be subjected to pipeline processing. However, the circuit that performs the folding A/D conversion operation and the circuit that performs the cyclic A/D conversion operation are different from a circuit that performs the acyclic A/D conversion operation. Then, pipeline processing can be performed between the folding A/D conversion operation and the acyclic A/D conversion operation. Further, the pipeline processing can be performed between the cyclic A/D conversion operation and the acyclic A/D conversion operation. In this case, control for shifting the timing of the folding A/D conversion operation and the timing of the acyclic A/D conversion operation is effective from the viewpoint of noise reduction. Similarly, control for shifting the timing of the cyclic A/D conversion operation and the timing of the acyclic A/D conversion operation is effective from the viewpoint of noise reduction.

Modification Example 4

In the above embodiment, the second A/D conversion unit 7 includes one circuit that performs a cyclic A/D conversion operation. The second A/D conversion unit may include two or more circuits that perform a cyclic A/D conversion operation. For example, when the second A/D conversion unit includes the two circuits that perform a cyclic A/D conversion operation, the circuit in a first stage and the circuit in a second stage have a common configuration as a circuit (see the second A/D conversion unit 7 in FIG. 6). However, electrical characteristics of respective electrical elements included in the circuits are different from one another.

REFERENCE SIGNS LIST 1, 1A: A/D converter
2: CDS circuit
3, 3A: Front stage A/D conversion unit
4: Rear stage A/D conversion unit
5: Timing control unit
6: First A/D conversion unit
7: Second A/D conversion unit
7A: Third A/D conversion unit
9a, 9b, 9c: Data conversion circuit
10, 10A: Reference voltage generation unit
15, 30, 31, 32, 34, 37a, 37b, 37c, 45, 51, 52a, 52b, 52c, 52d, 53, 54, 55, 56, 57a, 57b, 57c, 63a, 63b, 63c, 63d, 64a, 64b, 64c, 64d, 65b, 66, 76b, 76c, 76d, 76e, 76f, 76g: Switch
11, 27, 47: Operational amplifier
12, 13, 28, 29, 48, 49, 50, 62a, 62b, 62c, 62d: Capacitor
21, 41, 41A: Gain stage
22, 42: Sub A/D conversion circuit
22a, 22b, 42a, 42b, 61, 72: Comparator
23, 43: Logic circuit
24, 44: D/A conversion circuit
35, 36: Criterion voltage source
37, 57: Switch circuit
44a, 44b: Output 67: Register
71, 81: S/H circuit
73: Decoder
74: Register
75, 88, 107: Control circuit
77: Voltage division circuit
82: Comparator
83: Flip flop circuit
84: Latch circuit
85: Conversion circuit
86: Ramp signal generation circuit
87: Gray code counter
100: CMOS image sensor
101: Vertical shift register
102: Image array
103: Pixel
103a: Sensor circuit
103b: Amplifier
104: Array
105: Data register
106: Horizontal shift register
COL: Column line
D1: First digital value
D2: Second digital value
D3: Third digital value
D2H, D2L, $\phi_{DH}$, $\phi_{CDS}$, $\phi_{S1}$, $\phi_{Sa}$, $\phi_{Sb}$, $\phi_{Sc}$, $\phi_1$: Control signal
J1: Connection point
$L_{OAD}$: Storage control input
$L_{COM}$: Criterion potential line
$PD_i$: Photodiode
$Q_{NET}$: Charge
$R_i$, $S_i$, $TX_i$, $V_{CON\_F}$, $V_{CON\_C}$: Control signal
T1, T2, T3, T4: Transistor
$V_{OPF}$: First residual analog signal
$V_{RCH}$: First conversion reference voltage
$V_{RH}$: First criterion reference voltage
$V_{RL}$: Second criterion reference voltage
$V_{OPF}$: First residual analog signal
$V_{OPC}$: Second residual analog signal
$V_{RCL}$: Second conversion reference voltage
$V_{COM}$: Criterion potential
$V_{IN}$: Input value

The invention claimed is:

1. An A/D converter disposed in a column of an image sensor and converting a signal from the image sensor into a digital value, the A/D converter comprising:

a front stage A/D conversion unit including a first A/D conversion unit that receives an analog signal from the image sensor and generates a first digital value and a first residual analog signal that is a computation value in a folding integration A/D conversion operation through the folding integration A/D conversion operation, and a second A/D conversion unit that receives the first residual analog signal from the first A/D conversion unit and generates a second digital value and a second residual analog signal that is a computation value in a cyclic A/D conversion operation through the cyclic A/D conversion operation;

a rear stage A/D conversion unit that receives the second residual analog signal from the front stage A/D conversion unit and generates a third digital value through an acyclic A/D conversion operation; and a timing control unit that controls a first storage operation, a first computation operation, a second storage operation, and a second computation operation, wherein the first A/D conversion unit includes a first circuit that performs the folding integration A/D conversion operation, the first circuit includes a first gain stage including a first input that receives the analog signal, a first front stage capacitor that is able to be connected to the first input, a first operational amplifier including an inverting input that is able to be connected to the first front stage capacitor, a first output connected to an output of the first operational amplifier, and a first feedback capacitor that is able to be connected between the inverting input and the output of the first operational amplifier, the folding integration A/D conversion operation includes the first storage operation in which the first front stage capacitor stores the analog signal, and the first computation operation in which the first gain stage generates the first residual analog signal that is a computation value, in the first storage operation, the first front stage capacitor is connected to the first input, and the first feedback capacitor is connected between the output and the inverting input of the first operational amplifier, in the first computation operation, the first front stage capacitor is connected to the inverting input of the first operational amplifier, and the first feedback capacitor is connected between the output and the inverting input of the first operational amplifier, the second A/D conversion unit includes at least one second circuit that performs the cyclic A/D conversion operation, the second circuit includes a second gain stage including a second input that receives the first residual analog signal or the second residual analog signal, a second front stage capacitor that is able to be connected to the second input, a second operational amplifier including an inverting input that is able to be connected to the second front stage capacitor, a second output connected to an output of the second operational amplifier, and a second feedback capacitor that is able to be connected between the inverting input and the output of the second operational amplifier, the cyclic A/D conversion operation includes the second storage operation in which the second front stage capacitor stores the first residual analog signal or the second residual analog signal, and the second computation operation in which the second gain stage generates the second residual analog signal that is a computation value, in the second storage operation, the second front stage capacitor is connected to the second input or the output of the second operational amplifier, and the second feedback capacitor is connected between the second input or the output of the second operational amplifier and the inverting input of the second operational amplifier, in the second computation operation, the second front stage capacitor is connected to the second operational amplifier, and the second feedback capacitor is connected between the output and the inverting input of the second operational amplifier, and the timing control unit performs control so that a timing at which switching between the first storage operation and the first computation operation is performed is excluded from an end period of the second storage operation and an end period of the second computation operation.

2. An A/D converter disposed in a column of an image sensor and converting a signal from the image sensor into a digital value, the A/D converter comprising:
- a front stage A/D conversion unit including a first A/D conversion unit that receives an analog signal from the image sensor and generates a first digital value and a first residual analog signal that is a computation value in a folding integration A/D conversion operation through the folding integration A/D conversion operation, and a second A/D conversion unit that receives the first residual analog signal from the first A/D conversion unit and generates a second digital value and a second residual analog signal that is a computation value in a cyclic A/D conversion operation through the cyclic A/D conversion operation;
- a rear stage A/D conversion unit that receives the second residual analog signal from the front stage A/D conversion unit and generates a third digital value through an acyclic A/D conversion operation; and
- a timing control unit that controls a first storage operation and a first computation operation, and controls a comparison operation of comparing the second residual analog signal in the rear stage A/D conversion unit with a reference voltage,
- wherein the first A/D conversion unit includes a first circuit that performs the folding integration A/D conversion operation,
- the first circuit includes a first gain stage including a first input that receives the analog signal, a first front stage capacitor that is able to be connected to the first input, a first operational amplifier including an inverting input that is able to be connected to the first front stage capacitor, a first output connected to an output of the first operational amplifier, and a first feedback capacitor that is able to be connected between the inverting input and the output of the first operational amplifier,
- the folding integration A/D conversion operation includes the first storage operation in which the first front stage capacitor stores the analog signal, and the first computation operation in which the first gain stage generates the first residual analog signal that is a computation value,
- in the first storage operation, the first front stage capacitor is connected to the first input, and the first feedback capacitor is connected between the output and the inverting input of the first operational amplifier,
- in the first computation operation, the first front stage capacitor is connected to the inverting input of the first operational amplifier, and the first feedback capacitor is connected between the output and the inverting input of the first operational amplifier,
- the second A/D conversion unit includes at least one second circuit that performs the cyclic A/D conversion operation,
- the second circuit includes a second gain stage including a second input that receives the first residual analog signal or the second residual analog signal, a second front stage capacitor that is able to be connected to the second input, a second operational amplifier including an inverting input that is able to be connected to the second front stage capacitor, a second output connected to an output of the second operational amplifier, and a second feedback capacitor that is able to be connected between the inverting input and the output of the second operational amplifier,
- the cyclic A/D conversion operation includes a second storage operation in which the second front stage capacitor stores the first residual analog signal or the second residual analog signal, and a second computation operation in which the second gain stage generates the second residual analog signal that is a computation value,
- in the second storage operation, the second front stage capacitor is connected to the second input or the output of the second operational amplifier, and the second feedback capacitor is connected between the second input or the output of the second operational amplifier and the inverting input of the second operational amplifier,
- in the second computation operation, the second front stage capacitor is connected to the second operational amplifier, and the second feedback capacitor is connected between the output and the inverting input of the second operational amplifier,
- the rear stage A/D conversion unit is a successive comparison A/D conversion circuit that includes a comparator that compares the second residual analog signal that is a computation value from the front stage A/D conversion unit with a successively changing reference voltage, the successive comparison A/D conversion circuit successively generating the third digital value on the basis of an output of the comparator, and
- the timing control unit performs control so that a timing of the comparison operation is excluded from an end period of the first storage operation and an end period of the first computation operation.

3. An A/D converter disposed in a column of an image sensor and converting a signal from the image sensor into a digital value, the A/D converter comprising:
- a front stage A/D conversion unit including a first A/D conversion unit that receives an analog signal from the image sensor and generates a first digital value and a first residual analog signal that is a computation value in a folding integration A/D conversion operation through the folding integration A/D conversion operation, and a second A/D conversion unit that receives the first residual analog signal from the first A/D conversion unit and generates a second digital value and a second residual analog signal that is a computation value in a cyclic A/D conversion operation through the cyclic A/D conversion operation;
- a rear stage A/D conversion unit that receives the second residual analog signal from the front stage A/D conversion unit and generates a third digital value through an acyclic A/D conversion operation; and
- a timing control unit that controls a second storage operation and a second computation operation, and controls a comparison operation of comparing the second residual analog signal in the rear stage A/D conversion unit with a reference voltage,
- wherein the first A/D conversion unit includes a first circuit that performs the folding integration A/D conversion operation,
- the first circuit includes a first gain stage including a first input that receives the analog signal, a first front stage capacitor that is able to be connected to the first input, a first operational amplifier including an inverting input that is able to be connected to the first front stage capacitor, a first output connected to an output of the first operational amplifier, and a first feedback capacitor that is able to be connected between the inverting input and the output of the first operational amplifier,
- the folding integration A/D conversion operation includes a first storage operation in which the first front stage capacitor stores the analog signal, and a first computation operation in which the first gain stage generates the first residual analog signal that is a computation value, in the first storage operation, the first front stage capacitor is connected to the first input, and the first feedback capacitor is connected between the output and the inverting input of the first operational amplifier, in the first computation operation, the first front stage capacitor is connected to the inverting input of the first operational amplifier, and the first feedback capacitor is connected between the output and the inverting input of the first operational amplifier, the second A/D conversion unit includes at least one second circuit that performs the cyclic A/D conversion operation, the second circuit includes a second gain stage including a second input that receives the first residual analog signal or the second residual analog signal, a second front stage capacitor that is able to be connected to the second input, a second operational amplifier including an inverting input that is able to be connected to the second front stage capacitor, a second output connected to an output of the second operational amplifier, and a second feedback capacitor that is able to be connected between the inverting input and the output of the second operational amplifier, the cyclic A/D conversion operation includes the second storage operation in which the second front stage capacitor stores the first residual analog signal or the second residual analog signal, and the second computation operation in which the second gain stage generates the second residual analog signal that is a computation value, in the second storage operation, the second front stage capacitor is connected to the second input or the output of the second operational amplifier, and the second feedback capacitor is connected between the second input or the output of the second operational amplifier and the inverting input of the second operational amplifier, in the second computation operation, the second front stage capacitor is connected to the second operational amplifier, and the second feedback capacitor is connected between the output and the inverting input of the second operational amplifier, the rear stage A/D conversion unit is a successive comparison A/D conversion circuit that includes a comparator that compares the second residual analog signal that is a computation value from the front stage A/D conversion unit with a successively changing reference voltage, the successive comparison A/D conversion circuit successively generating the third digital value on the basis of an output of the comparator, and the timing control unit performs control so that a timing of the comparison operation is excluded from an end period of the second storage operation and an end period of the second computation operation.

4. An A/D converter disposed in a column of an image sensor and converting a signal from the image sensor into a digital value, the A/D converter comprising:

a front stage A/D conversion unit including a first A/D conversion unit that receives an analog signal from the image sensor and generates a first digital value and a first residual analog signal that is a computation value in a folding integration A/D conversion operation through the folding integration A/D conversion operation, and a second A/D conversion unit that receives the first residual analog signal from the first A/D conversion unit and generates a second digital value and a second residual analog signal that is a computation value in a cyclic A/D conversion operation through the cyclic A/D conversion operation;

a rear stage A/D conversion unit that receives the second residual analog signal from the front stage A/D conversion unit and generates a third digital value through an acyclic A/D conversion operation; and a timing control unit that controls a first storage operation and a first computation operation, and controls a comparison operation of comparing the second residual analog signal in the rear stage A/D conversion unit with a reference voltage, wherein the front stage A/D conversion unit includes a third circuit that is able to be switched between a circuit that performs the folding integration A/D conversion operation and a circuit that performs the cyclic A/D conversion operation by controlling a plurality of switches, the third circuit includes a common gain stage including a common input that receives the analog signal or the first residual analog signal, a common front stage capacitor that is able to be connected to the common input, a common operational amplifier including an inverting input that is able to be connected to the common front stage capacitor, a common output connected to an output of the common operational amplifier, and a common feedback capacitor that is able to be connected between the inverting input and the output of the common operational amplifier, the folding integration A/D conversion operation includes the first storage operation in which the common front stage capacitor stores the analog signal and the first computation operation in which the common gain stage generates the first residual analog signal that is a computation value, in the first storage operation, the common front stage capacitor is connected to the common input, and the common feedback capacitor is connected between the output and the inverting input of the common operational amplifier, in the first computation operation, the common front stage capacitor is connected to the common operational amplifier, and the common feedback capacitor is connected between the output and the inverting input of the common operational amplifier, the cyclic A/D conversion operation includes a second storage operation in which the common front stage capacitor stores the first residual analog signal or the second residual analog signal, and a second computation operation in which the common gain stage generates the second residual analog signal that is a computation value, in the second storage operation, the common front stage capacitor is connected to the common input or the output of the common operational amplifier, and the common feedback capacitor is connected between the common input or the output of the common operational amplifier and the inverting input of the common operational amplifier, and in the second computation operation, the common front stage capacitor is connected to the common operational amplifier, and the common feedback capacitor is connected between the output and the inverting input of the common operational amplifier, the rear stage A/D conversion unit is a successive comparison A/D conversion circuit that includes a comparator that compares the second residual analog signal that is a computation value from the front stage A/D conversion unit with a successively changing reference voltage, the successive comparison A/D conversion circuit successively generating the third digital value on the basis of an output of the comparator, and the timing control unit performs control so that a timing of the comparison operation is excluded from an end period of the first storage operation and an end period of the first computation operation.

5. An A/D converter disposed in a column of an image sensor and converting a signal from the image sensor into a digital value, the A/D converter comprising:

a front stage A/D conversion unit including a first A/D conversion unit that receives an analog signal from the image sensor and generates a first digital value and a first residual analog signal that is a computation value in a folding integration A/D conversion operation through the folding integration A/D conversion operation, and a second A/D conversion unit that receives the first residual analog signal from the first A/D conversion unit and generates a second digital value and a second residual analog signal that is a computation value in a cyclic A/D conversion operation through the cyclic A/D conversion operation;

a rear stage A/D conversion unit that receives the second residual analog signal from the front stage A/D conversion unit and generates a third digital value through an acyclic A/D conversion operation; and a timing control unit that controls a second storage operation and a second computation operation, and controls a comparison operation of comparing the second residual analog signal in the rear stage A/D conversion unit with a reference voltage, wherein the front stage A/D conversion unit includes a third circuit that is able to be switched between a circuit that performs the folding integration A/D conversion operation and a circuit that performs the cyclic A/D conversion operation by controlling a plurality of switches, the third circuit includes a common gain stage including a common input that receives the analog signal or the first residual analog signal, a common front stage capacitor that is able to be connected to the common input, a common operational amplifier including an inverting input that is able to be connected to the common front stage capacitor, a common output connected to an output of the common operational amplifier, and a common feedback capacitor that is able to be connected between the inverting input and the output of the common operational amplifier, the folding integration A/D conversion operation includes a first storage operation in which the common front stage capacitor stores the analog signal and a first computation operation in which the common gain stage generates the first residual analog signal that is a computation value, in the first storage operation, the common front stage capacitor is connected to the common input, and the common feedback capacitor is connected between the output and the inverting input of the common operational amplifier, in the first computation operation, the common front stage capacitor is connected to the common operational amplifier, and the common feedback capacitor is connected between the output and the inverting input of the common operational amplifier, the cyclic A/D conversion operation includes the second storage operation in which the common front stage capacitor stores the first residual analog signal or the second residual analog signal, and the second computation operation in which the common gain stage generates the second residual analog signal that is a computation value, in the second storage operation, the common front stage capacitor is connected to the common input or the output of the common operational amplifier, and the common feedback capacitor is connected between the common input or the output of the common operational amplifier and the inverting input of the common operational amplifier, and in the second computation operation, the common front stage capacitor is connected to the common operational amplifier, and the common feedback capacitor is connected between the output and the inverting input of the common operational amplifier, the rear stage A/D conversion unit is a successive comparison A/D conversion circuit that includes a comparator that compares the second residual analog signal that is a computation value from the front stage A/D conversion unit with a successively changing reference voltage, the successive comparison A/D conversion circuit successively generating the third digital value on the basis of an output of the comparator, and the timing control unit performs control so that a timing of the comparison operation is excluded from an end period of the second storage operation and an end period of the second computation operation.

* * * * *